US012777856B2

(12) United States Patent
Lin et al.

(10) Patent No.: US 12,777,856 B2
(45) Date of Patent: Oct. 27, 2026

(54) N-DIPOLE MATERIAL FOR STACKED TRANSISTORS

(71) Applicant: Taiwan Semiconductor Manufacturing Company, Ltd., Hsin-Chu (TW)

(72) Inventors: Cheng-Ming Lin, Kaohsiung (TW); Wei-Yen Woon, Taoyuan (TW); Szuya Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 619 days.

(21) Appl. No.: 18/315,232

(22) Filed: May 10, 2023

(65) Prior Publication Data

US 2024/0249943 A1 Jul. 25, 2024

Related U.S. Application Data

(60) Provisional application No. 63/481,262, filed on Jan. 24, 2023.

(51) Int. Cl.
*H10P 32/14* (2026.01)
*H10D 30/01* (2025.01)
(Continued)

(52) U.S. Cl.
CPC ........... *H10P 32/14* (2026.01); *H10D 30/014* (2025.01); *H10D 30/62* (2025.01);
(Continued)

(58) Field of Classification Search
CPC ............. H10D 30/014; H10D 30/6735; H10D 62/121; H10D 84/0144; H10D 84/0181
See application file for complete search history.

(56) References Cited

U.S. PATENT DOCUMENTS

2021/0391220 A1* 12/2021 Savant ................. H10D 64/017
2021/0391439 A1* 12/2021 Pao .................... H10D 64/0134
(Continued)

FOREIGN PATENT DOCUMENTS

| | | | | | |
|---|---|---|---|---|---|
| CN | 113675197 | A | * 11/2021 | ............ | H10W 20/20 |
| KR | 20210148845 | A | 12/2021 | | |
| TW | 392255 | B | 6/2000 | | |

*Primary Examiner* — Tuan A Hoang
(74) *Attorney, Agent, or Firm* — HAYNES AND BOONE, LLP

(57) ABSTRACT

Dipole engineering techniques for devices of stacked device structures are disclosed herein. An exemplary method for forming a gate stack of a transistor (e.g., a top transistor) of a transistor stack includes forming a high-k dielectric layer, forming an n-dipole dopant source layer over the high-k dielectric layer, performing a thermal drive-in process that drives an n-dipole dopant from the n-dipole dopant source layer into the high-k dielectric layer, and forming at least one electrically conductive gate layer over the high-k dielectric layer after removing the n-dipole dopant source layer. A drive-in temperature of the thermal drive-in process is less than 600° C. (e.g., about 300° C. to about 500° C.). The n-dipole dopant is strontium, erbium, magnesium, or a combination thereof. The method can further include tuning thermal drive-in process parameters to provide the gate dielectric with an n-dipole dopant profile having a peak located at a high-k/interfacial interface ±0.5 nm.

20 Claims, 21 Drawing Sheets

(51) Int. Cl.

| | |
|---|---|
| ***H10D 30/62*** | (2025.01) |
| ***H10D 30/67*** | (2025.01) |
| ***H10D 64/01*** | (2025.01) |
| ***H10D 84/01*** | (2025.01) |
| ***H10D 84/03*** | (2025.01) |
| ***H10D 84/85*** | (2025.01) |
| ***H10P 32/10*** | (2026.01) |
| *H10D 62/10* | (2025.01) |

(52) U.S. Cl.
CPC ..... *H10D 30/6735* (2025.01); *H10D 30/6757* (2025.01); *H10D 64/017* (2025.01); *H10D 84/0167* (2025.01); *H10D 84/0177* (2025.01); *H10D 84/038* (2025.01); *H10D 84/856* (2025.01); *H10P 32/19* (2026.01); *H10D 62/121* (2025.01); *H10D 84/0193* (2025.01); *H10D 84/853* (2025.01)

(56) References Cited

U.S. PATENT DOCUMENTS

2022/0037497 A1* 2/2022 Chung ................. H10D 30/024
2022/0319922 A1 10/2022 Wu et al.

* cited by examiner

N-DIPOLE MATERIAL FOR STACKED TRANSISTORS

This is a non-provisional application of and claims benefit of U.S. Provisional Patent Application Ser. No. 63/481,262, filed Jan. 24, 2023, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advancement is directed to providing ICs with transistors having multiple threshold voltages (Vt), which can boost performance of some transistors of an IC while reducing power consumption of other transistors of the IC. However, providing multiple threshold voltages has been challenging for multigate devices, such as fin-like field effect transistors, gate-all-around transistors including nanowires and/or nanosheets, and other types of multigate devices, because multigate devices are becoming very small, which leaves minimal room for tuning their threshold voltages using different work function metals. Though dipole engineering can provide multigate devices with multiple threshold voltages while minimizing and/or eliminating the need for using different work function metals, dipole engineering techniques present challenges as device stacking is implemented to realize further scaling. Accordingly, although existing threshold voltage tuning techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-11A and FIGS. 3B-11B are various views of a device, such as a transistor, of a stacked device structure, in portion or entirety, at various fabrication stages associated with the method of FIG. 2 according to various aspects of the present disclosure.

DETAILED DESCRIPTION

Figure 1:
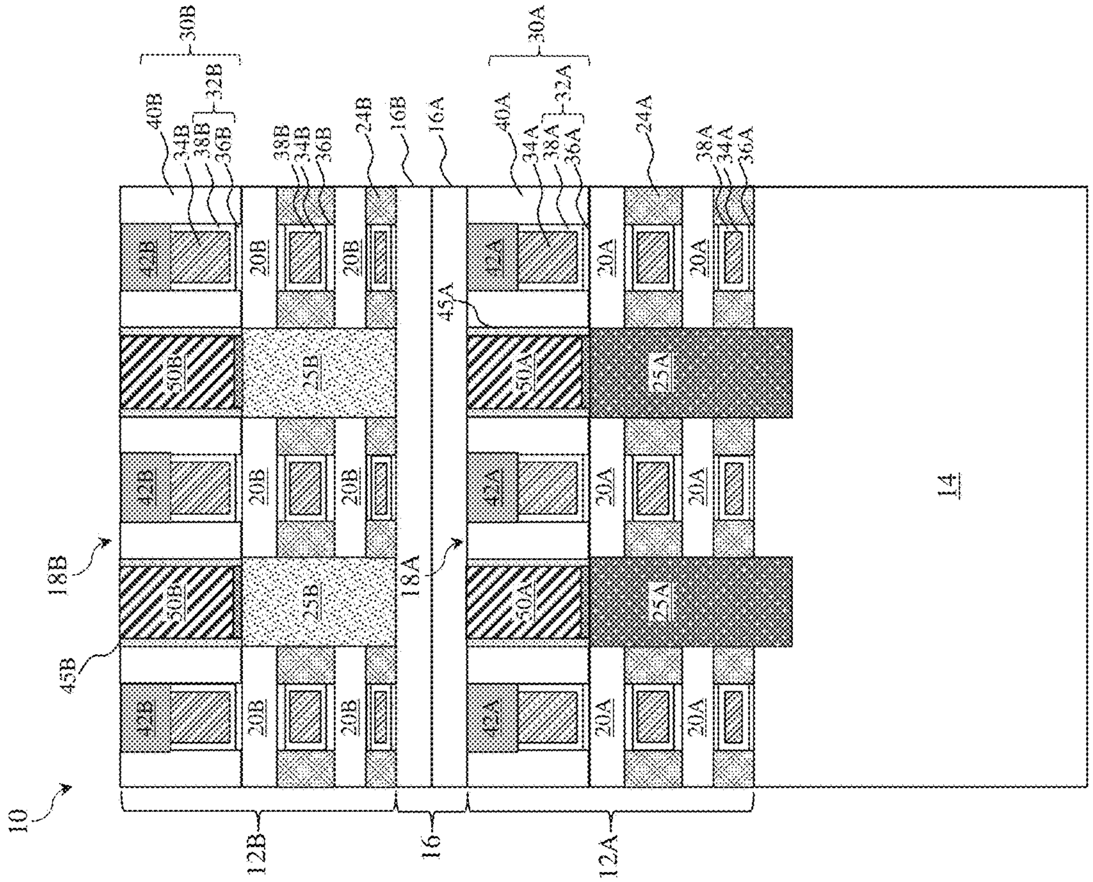
FIG. 1 is a fragmentary cross-sectional view of a stacked device structure, in portion or entirety, according to various aspects of the present disclosure.

The present disclosure relates generally to integrated circuit (IC) devices, and more particularly, to IC devices having stacked device structures, such as a transistor stack having an n-type transistor and a p-type transistor (i.e., complementary field effect transistors (CFETs)).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not mathematically or perfectly vertical and horizontal.

Stacked transistor structures, such as complementary field effect transistors (CFETs), can provide further density reduction for advanced IC technology nodes (particularly as IC technology nodes advance to 3 nm (N3) and below). FIG. 1 is a fragmentary cross-sectional view of a stacked device structure 10, in portion or entirety, according to various aspects of the present disclosure. Stacked device structure 10 includes a device 12A, a device 12B, a substrate 14, and an insulation layer 16. Device 12B is vertically stacked over device 12A, insulation layer 16 is disposed between and separates device 12B and device 12A, and device 12A is disposed over substrate 14. In the depicted embodiment, device 12A and device 12B are stacked back-to-front. For example, a backside of device 12B is attached and/or bonded to a frontside of device 12A by insulation layer 16, which includes an insulation layer 16A and an insulation layer 16B. In some embodiments, insulation layer 16A is formed on the frontside of device 12A, insulation layer 16B is formed on the backside of device 12B, and insulation layer 16B is attached to insulation layer 16A. FIG. 1 has been simplified for the sake of clarity to better understand the inventive concepts of the present disclosure. Additional features can be added in stacked device structure 10, and some of the features described below can be replaced, modified, or eliminated in other embodiments of stacked device structure 10.

In FIG. 1, device 12A and device 12B include at least one electrically functional device, such as a transistor 18A and a transistor 18B, respectively. Stacked device structure 10 thus includes a transistor stack having a top transistor (e.g., transistor 18B) and a bottom transistor (e.g., transistor 18A) separated and isolated by insulation layer 16. In some embodiments, transistor 18A and transistor 18B are transistors of an opposite conductivity type. For example, transistor 18A is a p-type transistor, and transistor 18B is an n-type transistor, or vice versa. In such embodiments, transistor 18A and transistor 18B form a CFET. In some embodiments, transistor 18A and transistor 18B are transistors of a same conductivity type. For example, transistor 18A and transistor 18B are both n-type transistors or p-type transistors.

Device 12A includes various features and/or components, such as semiconductor layers 20A, inner spacers 24A, epitaxial source/drains 25A, and gate structures 30A. Each gate structure 30A can include a gate stack having a gate dielectric 32A and a gate electrode 34A. Gate dielectric 32A can include an interfacial layer 36A and a gate dielectric layer 38A (e.g., a high-k dielectric layer). The gate stack can further include a hard mask layer 42A. Each gate structure 30A can further include gate spacers 40A disposed along sidewalls of the gate stack. Device 12A further includes dielectric layers, such as an interlayer dielectric (ILD) layer and a contact etch stop layer (CESL) 45A, and source/drain contacts 50A.

In the depicted embodiment, transistor 18A is a gate-all-around (GAA) transistor. For example, transistor 18A has two channels provided by respective semiconductor layers 20A (referred to as channel layers 20A hereafter), which are suspended over substrate 14 and extend between respective source/drains (e.g., epitaxial source/drains 25A). Transistor 18A further has a respective gate structure 30A disposed over its channel layers 20A and between its epitaxial source/drains 25A, where inner spacers 24A are disposed between the gate stack of its gate structure 30A and its epitaxial source/drains 25A. Along a gate widthwise direction (e.g., in an X-Z plane), such as depicted, the gate stack of gate structure 30A is over top channel layer 20A, between channel layers 20A, and between bottom channel layer 20A and a mesa of substrate 14. Along a gate lengthwise direction (e.g., in a Y-Z plane), the gate stack of gate structure 30A wraps around channel layers 20A. During operation of the GAA transistor, current can flow through channel layers 20A and between epitaxial source/drains 25A.

Device 12B includes various features and/or components, such as semiconductor layers 20B, inner spacers 24B, epitaxial source/drains 25B, and gate structures 30B. Each gate structure 30B can include a gate stack having a gate dielectric 32B and a gate electrode 34B. Gate dielectric 32B can include an interfacial layer 36B and a gate dielectric layer 38B (e.g., a high-k dielectric layer). The gate stack can further include a hard mask layer 42B. Each gate structure 30B can further include gate spacers 40B disposed along sidewalls of the gate stack. Device 12B further includes dielectric layers, such as an ILD layer and/or a CESL 45B, and source/drain contacts 50B disposed on epitaxial source/drains 25B.

In the depicted embodiment, transistor 18B is also a GAA transistor. For example, transistor 18B has two channels provided by respective semiconductor layers 20B (referred to as channel layers 20B hereafter), which are suspended over substrate 14 and extend between respective source/drains (e.g., epitaxial source/drains 25B). Transistor 18B further has a respective gate structure 30B disposed over its channel layers 20B and between its epitaxial source/drains 25B, where inner spacers 24B are disposed between the gate stack of its gate structure 30B and its epitaxial source/drains 25B. Along a gate widthwise direction (e.g., in an X-Z plane), such as depicted, the gate stack of gate structure 30B is over top channel layer 20B, between channel layers 20B, and between bottom channel layer 20B and insulation layer 16. Along a gate lengthwise direction (e.g., in a Y-Z plane), the gate stack of gate structure 30B wraps around channel layers 20B. During operation of the GAA transistor, current can flow through channel layers 20B and between epitaxial source/drains 25B.

Transistors of a stacked transistor structure, such as stacked device structure 10, can be fabricated separately, monolithically, or sequentially. When fabricated separately, a top transistor and a bottom transistor may be separately fabricated, and then, the top transistor is bonded/attached to the bottom transistor. When fabricated monolithically, a top transistor and a bottom transistor are fabricated from an initial device precursor. For example, a first set of semiconductor layers may be bonded/attached to a second set of semiconductor layers and then processed to form the top transistor and the bottom transistor, respectively. When fabricated sequentially, a first set of semiconductor layers may be processed to form a bottom transistor, and then, a second set of semiconductor layers is attached/bonded to the bottom transistor and processed to form a top transistor (i.e., the top transistor is fabricated on the bottom transistor). In monolithic and sequential fabrication schemes, the bottom transistor may be subjected to high temperatures used to fabricate the top transistor. For example, when tuning a top transistor's threshold voltage using dipole engineering (e.g., by incorporating dipole dopant into a gate stack thereof), temperatures of at least 600° C. are needed to drive-in lanthanum-based dopant (an n-dipole dopant) into a high-k dielectric layer of a gate stack of the top transistor. Such high temperatures can degrade electrical performance and/or reliability of the bottom transistor. For example, temperatures exceeding 600° C. can undesirably modify a doping profile of the bottom transistor, thereby undesirably altering its threshold voltage and/or drive current ($I_{on}$).

To address these challenges, the present disclosure provides n-dipole dopants that can be driven into an adjacent layer, such as a gate dielectric layer, at low temperatures and thus provide low-temperature threshold voltage tuning of a transistor. Exemplary n-dipole dopants disclosed herein include strontium (Sr), erbium (Er), magnesium (Mg), or a combination thereof, which have corresponding drive-in temperatures that are less than 600° C., such as drive-in temperatures of about 300° C. to about 500° C. The proposed n-dipole dopants are particularly advantageous for stacked device structures, such as CFETs, because they can provide multiple threshold voltage tuning of a top device of a stacked device structure with minimal impact to electrical characteristics and/or structural characteristics to an already fabricated, bottom device of the stacked device structure. Further, electrical characteristics and/or structural characteristics of the top device may be improved by minimizing its exposure to high temperatures, such as those exceeding 600° C. Further, in some embodiments, both n-type transistors and p-type transistors can be flexibly provided with multiple threshold voltages by incorporating the disclosed n-dipole materials even with a same work function metal. This can obviate the need of patterning work function metals, making the disclosed low-temperature dipole engineering process very suitable for nano-sized transistors, such as FinFETs and GAA transistors. Details of improved gate stacks for transistors in stacked transistor structures and methods of fabrication and/or design thereof are described herein in the following pages. Different embodiments may have different advantages, and no particular advantage is required of any embodiment.

Figure 2:
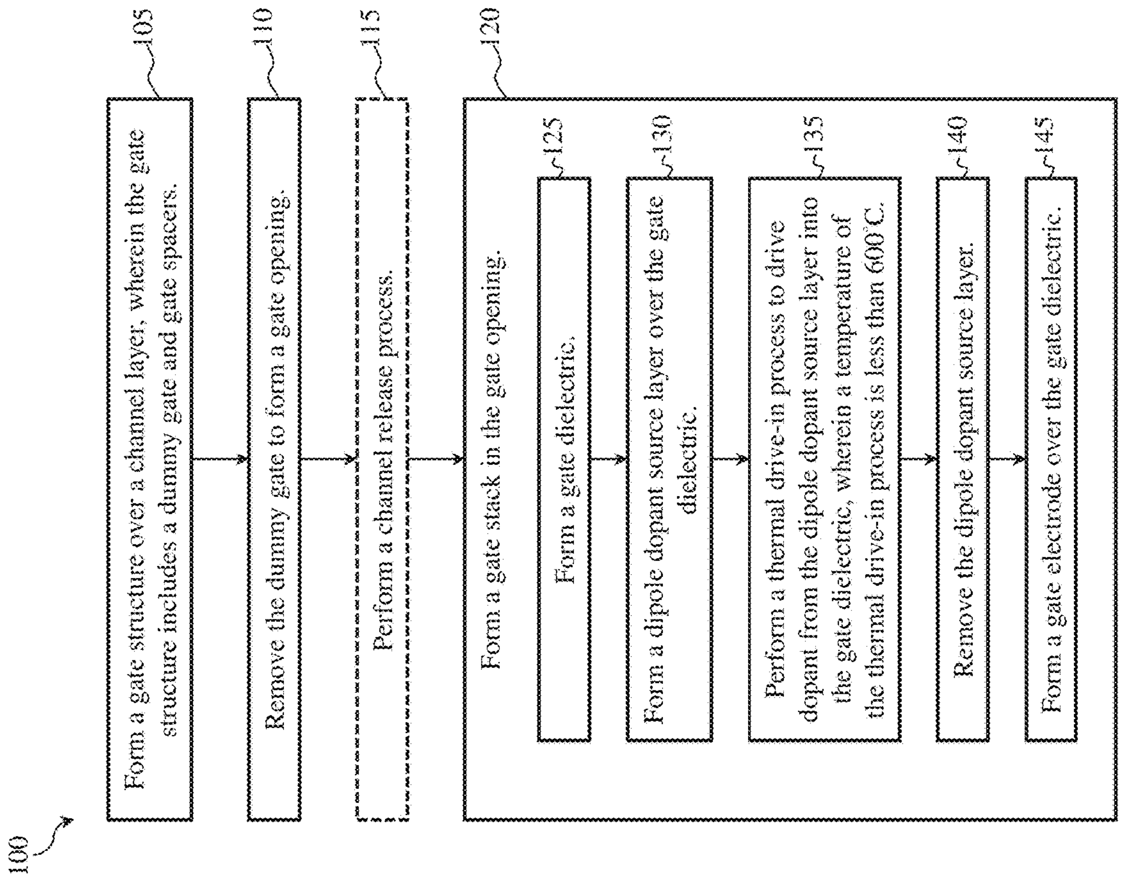
FIG. 2 is a flow chart of a method for fabricating a gate stack of a device of a stacked device structure, such as a gate stack of a device of stacked device structure of FIG. 1, according to various aspects of the present disclosure.

FIG. 2 is a flow chart of a method 100 for fabricating a gate stack of a transistor in a stacked transistor structure, such as a top transistor of the stacked transistor structure, according to various aspects of the present disclosure. FIGS. 3A-11A and FIGS. 3B-11B are various views of a transistor, such as transistor 18B of stacked transistor structure 10 of FIG. 1, in portion or entirety, at various fabrication stages associated with method 100 of FIG. 2 according to various aspects of the present disclosure. The cross-sectional views of FIGS. 3A-11A and FIGS. 3B-11B are taken (cut) along a gate widthwise direction (e.g., an x-direction) and a gate lengthwise direction (e.g., a y-direction), respectively, and thus, the cross-sectional views may be referred to as x-cut views and y-cut views, respectively. FIG. 12 illustrates an exemplary dipole dopant profile of a gate dielectric of a transistor, such as transistor 18B, after dipole engineering associated with FIGS. 7A-9A and FIGS. 7B-9B, according to various aspects of the present disclosure. FIG. 2, FIGS. 3A-11A, FIGS. 3B-11B, and FIG. 12 are discussed concurrently herein for ease of description and understanding. FIG. 2, FIGS. 3A-11A, FIGS. 3B-11B, and FIG. 12 have been simplified for the sake of clarity to better understand the inventive concepts of the present disclosure. Additional steps can be provided before, during, and after method 100, and some of the steps described can be moved, replaced, or eliminated for additional embodiments of method 100. Additional features can be added in transistor 18B of FIGS. 3A-11A and FIGS. 3B-11B, and some of the features described below can be replaced, modified, or eliminated in other embodiments of transistor 18B of FIGS. 3A-11A and FIGS. 3B-11B.

Figure 3B:
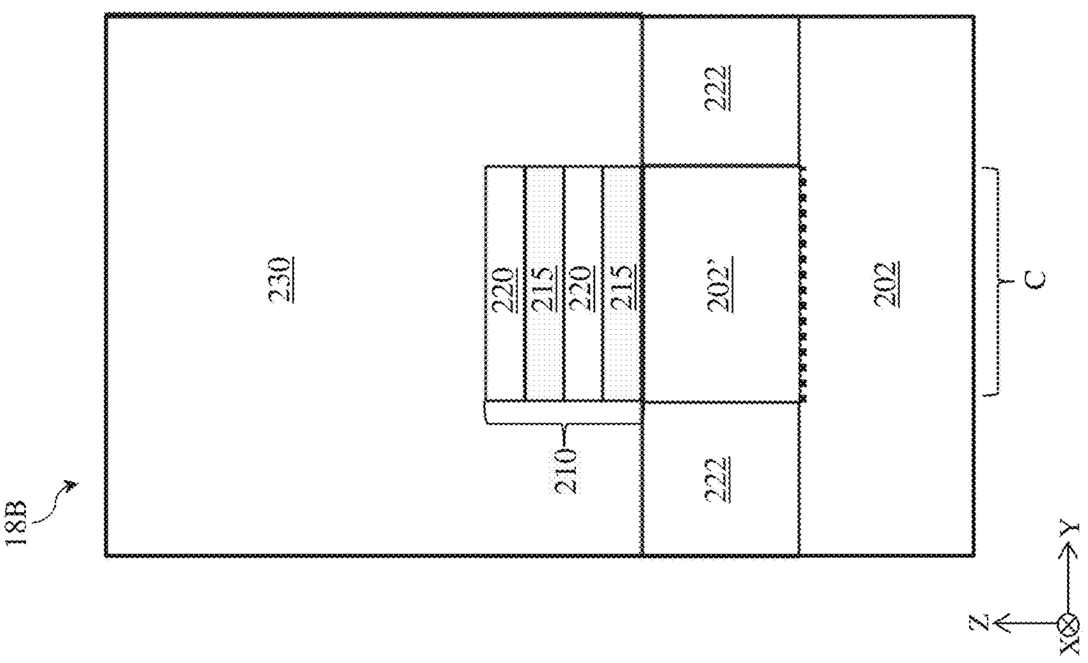
Figure 3A:
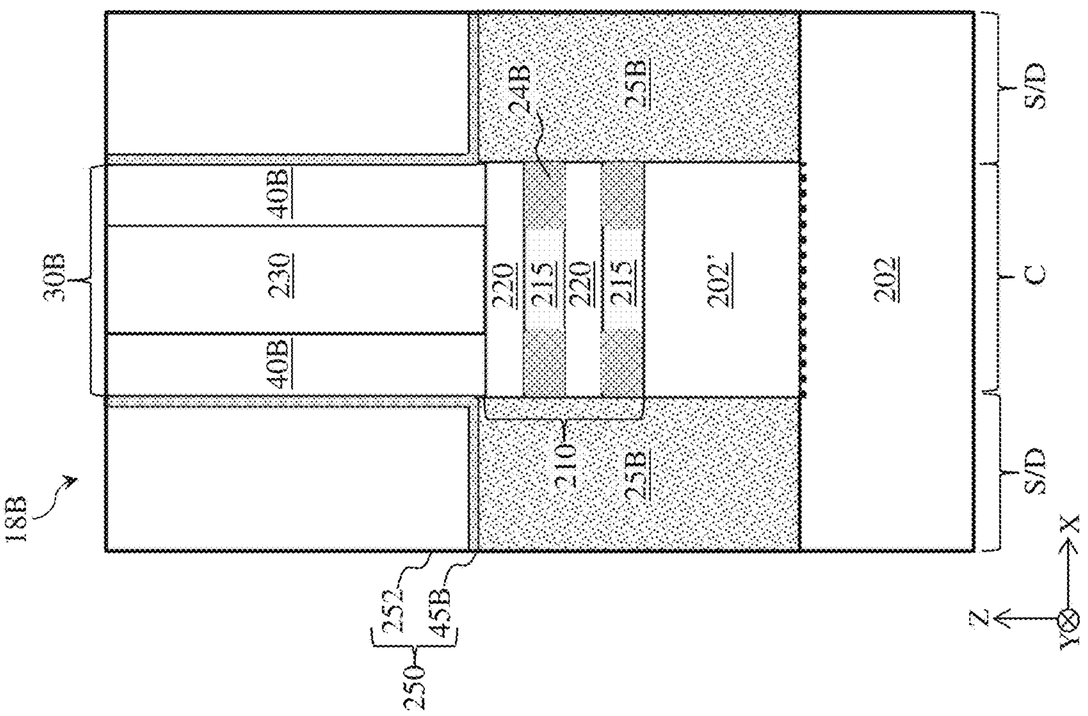

Turning to FIG. 2, FIG. 3A, and FIG. 3B, method 100 at block 105 includes forming a gate structure over a channel layer. The gate structure includes a dummy gate and gate spacers. This can include receiving and/or forming a device precursor that includes a substrate (wafer) 202, a channel layer 210 (depicted as having a mesa 202' (i.e., a patterned, projecting portion of substrate 202), semiconductor layers 215, and semiconductor layers 220), an isolation feature 222, inner spacers 24B, epitaxial source/drains 25B, gate structure 30B (depicted as having a dummy gate 230 and gate spacers 40B), and a dielectric layer 250. Channel layer 210 is in a channel region C, and epitaxial source/drains 25B are in source/drain regions S/D. Semiconductor layers 220 and mesa 202' of channel layer 210 extend between epitaxial source/drains 25B along the x-direction, and inner spacers 24B are between semiconductor layers 215 and epitaxial source/drains 25B. Gate structure 30B is disposed over channel layer 210 and between epitaxial source/drains 25B. In the X-Z plane, gate structure 30B is on a top of channel layer 210. In the Y-Z plane, gate structure 30B is on a top and sides of channel layer 210. For example, gate structure 30B wraps channel layer 210 in the Y-Z plane.

Substrate 202 includes an elementary semiconductor, such as silicon and/or germanium; a compound semiconductor, such as silicon carbide, gallium arsenide, gallium phosphide, indium phosphide, indium arsenide, indium antimonide, or a combination thereof; an alloy semiconductor, such as SiGe, GaAsP, AlInAs, AlGaAs, GaInAs, GaInP, GaInAsP, or a combination thereof; or a combination thereof. In the depicted embodiment, substrate 202 is a silicon substrate. In some embodiments, substrate 202 is a semiconductor-on-insulator substrate, such as a silicon-on-insulator (SOI) substrate, a silicon germanium-on-insulator (SGOI) substrate, or a germanium-on-insulator (GOI) substrate. Substrate 202 (and mesa 202') can include various doped regions, such as p-type doped regions (e.g., p-wells), n-type doped regions (e.g., n-wells), or a combination thereof. N-type doped regions include n-type dopants, such as phosphorus, arsenic, other n-type dopant, or a combination thereof. P-type doped regions include p-type dopants, such as boron, indium, other p-type dopant, or a combination thereof. In some embodiments, the doped regions include a combination of p-type dopants and n-type dopants. The doped regions can be formed directly on and/or in substrate 202, for example, providing a p-well structure, an n-well structure, a dual-well structure, a raised structure, other suitable structure, or a combination thereof. In some embodiments, substrate 202, mesa 202', and semiconductor layers thereover include a p-well, such as where transistor 18B is an n-type transistor, or an n-well, such as where transistor 18B is a p-type transistor.

Channel layer 210 extends along the x-direction, having a length along the x-direction, a width along a y-direction, and a height along a z-direction. Semiconductor layers 215 and semiconductor layers 220 are stacked vertically (e.g., along the z-direction) in an interleaving and/or alternating configuration from a top surface of substrate 202. A composition of semiconductor layers 215 is different than a composition of semiconductor layers 220 to achieve etching selectivity and/or different oxidation rates during subsequent processing. Semiconductor layers 215 and semiconductor layers 220 include different materials, constituent atomic percentages, constituent weight percentages, thicknesses, or a combination thereof to achieve desired etching selectivity during an etching process, such as an etch process implemented to form suspended channel layers in channel region C. For example, semiconductor layers 215 include silicon germanium, semiconductor layers 220 include silicon, and a silicon etch rate of semiconductor layers 220 is different than a silicon germanium etch rate of semiconductor layers 215 to a given etchant. In some embodiments, semiconductor layers 215 and semiconductor layers 220 include the same material but different constituent atomic percentages to achieve etching selectivity. For example, semiconductor layers 215 and semiconductor layers 220 include silicon germanium with different silicon atomic percentages and/or different germanium atomic percentages. The present disclosure contemplates semiconductor layers 215 and semiconductor layers 220 including any combination of semiconductor materials that provides desired etching selectivity, desired oxidation rate differences, desired performance characteristics (e.g., materials that maximize current flow), or a combination thereof, including any of the semiconductor materials disclosed herein.

Isolation feature 222 electrically isolates active device regions and/or passive device regions of a device from one another. For example, isolation feature 222 separates and electrically isolates an active region of transistor 18B (for example, channel layer 210 and/or epitaxial source/drains 25B thereof) from other device regions and/or devices. Isolation feature 222 includes silicon oxide, silicon nitride, silicon oxynitride, other suitable isolation material (including, for example, silicon, oxygen, nitrogen, carbon, other suitable isolation constituent, etc.), or a combination thereof. Isolation feature 222 may have a multilayer structure. For example, isolation feature 222 includes a bulk dielectric (e.g., an oxide layer) over a dielectric liner (including, for example, silicon nitride, silicon oxide, silicon oxynitride, silicon oxycarbonitride, or a combination thereof). In another example, isolation feature 222 includes a dielectric layer over a doped liner, such as a boron silicate glass (BSG) liner and/or a phosphosilicate glass (PSG) liner. Dimensions and/or characteristics of isolation feature 222 are configured to provide a shallow trench isolation (STI) structure, a deep trench isolation (DTI) structure, a local oxidation of silicon (LOCOS) structure, other suitable isolation structure, or a combination thereof. In the depicted embodiment, isolation feature 222 can be an STI.

Inner spacers 24B are disposed under gate spacers 40B and along sidewalls of semiconductor layers 215. Inner spacers 24B are disposed between and separate semiconductor layers 215 and epitaxial source/drains 25B. Inner spacers 24B are further disposed between adjacent semiconductor layers 220 and between bottommost semiconductor layer 220 and mesa 202'. Inner spacers 24B include a dielectric material that includes silicon, oxygen, carbon, nitrogen, other suitable constituent, or a combination thereof, such as silicon oxide, silicon nitride, silicon oxynitride, silicon carbide, silicon oxycarbonitride, etc. In some embodiments, inner spacers 24B include a low-k dielectric material. In some embodiments, dopants (for example, p-type dopants, n-type dopants, or a combination thereof) are introduced into the dielectric material, and inner spacers 24B include doped dielectric material(s).

Epitaxial source/drains 25B include a semiconductor material and can be doped with n-type dopants and/or p-type dopants. When forming a portion of an n-type transistor, such as in the depicted embodiment, epitaxial source/drains 25B can include silicon doped with carbon, phosphorous, arsenic, other n-type dopant, or a combination thereof. When forming a portion of a p-type transistor, epitaxial source/drains 25B can include silicon germanium or germanium doped with boron, other p-type dopant, or a combination thereof. Epitaxial source/drains 25B can include more than one semiconductor layer, where the semiconductor layers include the same or different materials and/or the same or different dopant concentrations. Epitaxial source/drains 25B can include materials and/or dopants that achieve desired tensile stress and/or compressive stress in channel region C. In some embodiments, doped regions, such as heavily doped source/drain (HDD) regions, lightly doped source/drain (LDD) regions, other doped regions, or a combination thereof, are disposed in epitaxial source/drains 25B. In some embodiments, doped regions, such as LDD regions, may extend into channel region C. As used herein, source/drain region, epitaxial source/drain, epitaxial source/drain feature, etc. may refer to a source of transistor and/or a device, a drain of a transistor and/or a device, or a source and/or a drain of multiple devices (e.g., including of transistor 18B and/or device 12B).

Dummy gate 230 extends lengthwise in a direction that is different than (e.g., orthogonal to) the lengthwise direction of channel layer 210. For example, dummy gate 230 extends lengthwise along the y-direction, having a length along the y-direction, a width along the x-direction, and a height along the z-direction. In the X-Z plane, dummy gate 230 is disposed on a top of channel layer 210. In the Y-Z plane, dummy gate 230 is disposed over a top and sidewalls of channel layer 210, such that dummy gate 230 wraps channel layer 210. Dummy gate 230 can include a dummy gate electrode and a dummy gate dielectric. The dummy gate electrode includes a suitable dummy gate material, and the dummy gate dielectric includes a suitable dielectric material. For example, the dummy gate electrode includes polysilicon (i.e., a poly gate) and the dummy gate dielectric includes silicon oxide (i.e., a dummy oxide). Dummy gate 230 can include additional layers, such as a hard mask layer, a capping layer, an interface layer, a diffusion layer, a barrier layer, other suitable layer, or a combination thereof.

Gate spacers 40B are adjacent to and along sidewalls of dummy gate 230. Gate spacers 40B can include seal spacers, offset spacers, sacrificial spacers, dummy spacers, main spacers, other suitable spacers, or a combination thereof. Gate spacers 40B can have single layer structures or multilayer structures. Gate spacers 40B include a dielectric material, which can include silicon, oxygen, carbon, nitrogen, other suitable constituent, or a combination thereof (e.g., silicon oxide, silicon nitride, silicon oxynitride, silicon carbide, silicon carbonitride, silicon oxycarbide, silicon oxycarbonitride, etc.). For example, gate spacers 40B can include silicon, oxygen, nitrogen, carbon, and hydrogen (i.e., gate spacers 40B are SiONCH layers).

Dielectric layer 250 is disposed over substrate 202, isolation feature 222, epitaxial source/drains 25B, and gate structure 30B. Dielectric layer 250 can have a multilayer structure, such as an interlayer dielectric (ILD) layer 252 over CESL 45B. ILD layer 252 includes a dielectric material including, for example, silicon oxide, carbon doped silicon oxide, silicon nitride, silicon oxynitride, tetraethyl orthosilicate (TEOS)-formed oxide, boron silicate glass (BSG), phosphosilicate glass (PSG), borophosphosilicate glass (BPSG), fluorosilicate glass (FSG), Black Diamond® (Applied Materials of Santa Clara, California), xerogel, aerogel, amorphous fluorinated carbon, parylene, benzocyclobutene-based (BCB) dielectric material, SiLK (Dow Chemical, Midland, Michigan), polyimide, other suitable dielectric material, or a combination thereof. In some embodiments, ILD layer 252 includes a dielectric material having a dielectric constant that is less than a dielectric constant of silicon dioxide (e.g., $k<3.9$). In some embodiments, ILD layer 252 includes a dielectric material having a dielectric constant that is less than about 2.5 (i.e., an extreme low-k (ELK) dielectric material), such as porous silicon oxide, silicon carbide (SiC), carbon-doped oxide (e.g., an SiCOH-based material (having, for example, Si—$CH_3$ bonds)), or a combination thereof, each of which is tuned/configured to have a dielectric constant less than about 2.5. CESL 45B includes a dielectric material that is different than the dielectric material of ILD layer 252. For example, where ILD layer 252 includes a low-k dielectric material (e.g., porous silicon oxide), CESL 45B can include silicon and nitrogen, such as silicon nitride, silicon carbonitride, or silicon oxycarbonitride.

In some embodiments, the device precursor is received before and/or after forming dielectric layer 250. Forming dielectric layer 250 can include depositing a dielectric material over substrate 202, isolation feature 222, epitaxial source/drains 25B, and gate structure 30B and performing a planarization process, such as a chemical mechanical polishing (CMP), on the dielectric material. The planarization process removes any dielectric material from over gate structure 30B. Dummy gate 230 can function as a planarization stop layer, and the planarization process can be performed until reaching dummy gate 230. The planarization process can planarize a top surface of dielectric layer 250 and a top surface of gate structure 30B. In some embodiments, dielectric layer 250 is a device-level dielectric layer of a multilayer interconnect (MLI) feature, which electrically connects devices (for example, transistors, resistors, capacitors, inductors, etc.), components of devices (for example, gates and/or source/drains), devices within the MLI feature, components of the MLI feature, or a combination thereof, such that the devices and/or components can operate as specified by design requirements.

Figure 4B:
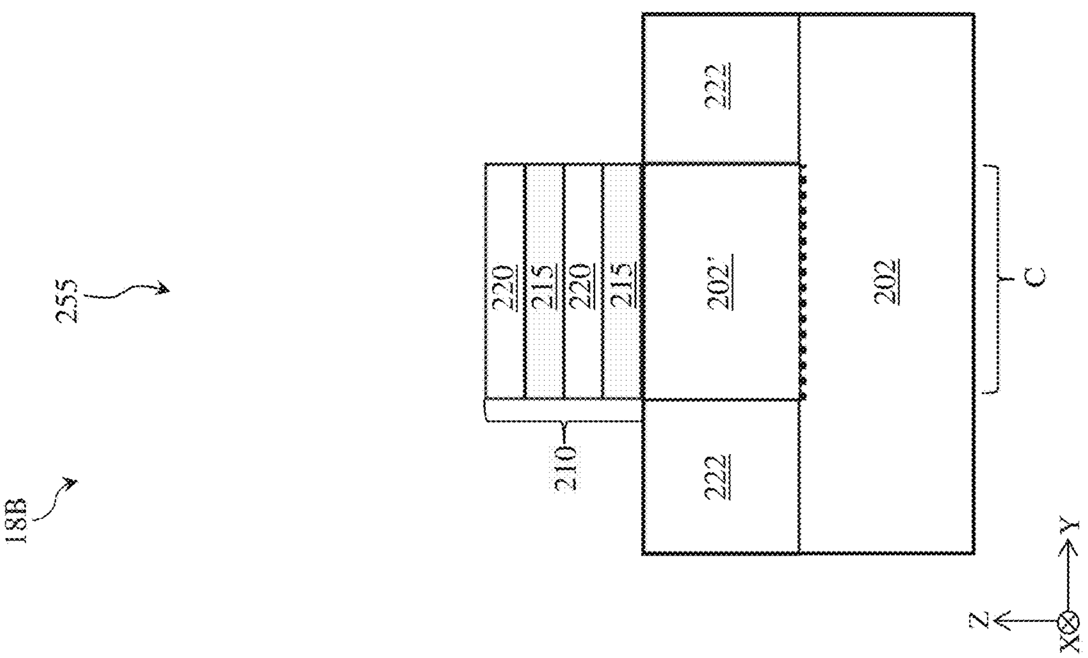
Figure 4A:
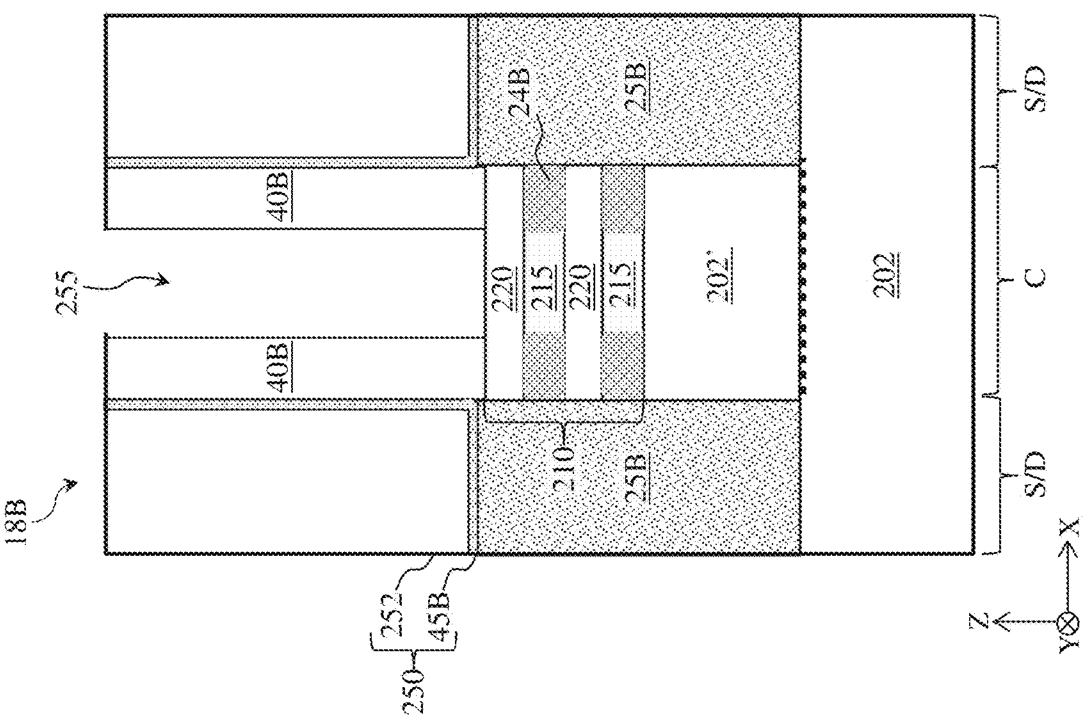

Turning to FIG. 2, FIG. 4A, and FIG. 4B, method 100 at block 110 includes removing dummy gate 230 to form a gate opening 255 that exposes channel layer 210. Gate opening 255 has sidewalls formed by gate spacers 40B and a bottom formed by channel layer 210 and/or isolation feature 222. In some embodiments, an etching process selectively removes dummy gate 230 with respect to gate spacers 40B, dielectric layer 250, or a combination thereof. For example, the etching process substantially removes dummy gate 230 but does not remove, or does not substantially remove, gate spacers 40B, isolation feature 222, dielectric layer 250, etc. In some embodiments, an etchant is selected for the etching process that etches polysilicon (i.e., dummy gate 230) at a higher rate than dielectric materials (i.e., gate spacers 40B, dielectric layer 250, etc.) (i.e., the etchant has a high etch selectivity with respect to polysilicon). The etching process is a dry etch, a wet etch, other suitable etch, or a combination thereof. In some embodiments, a patterned mask layer (an etch mask) covers and protects dielectric layer 250 and/or gate spacers 40B but exposes dummy gate 230 during the etching process.

Figure 5B:
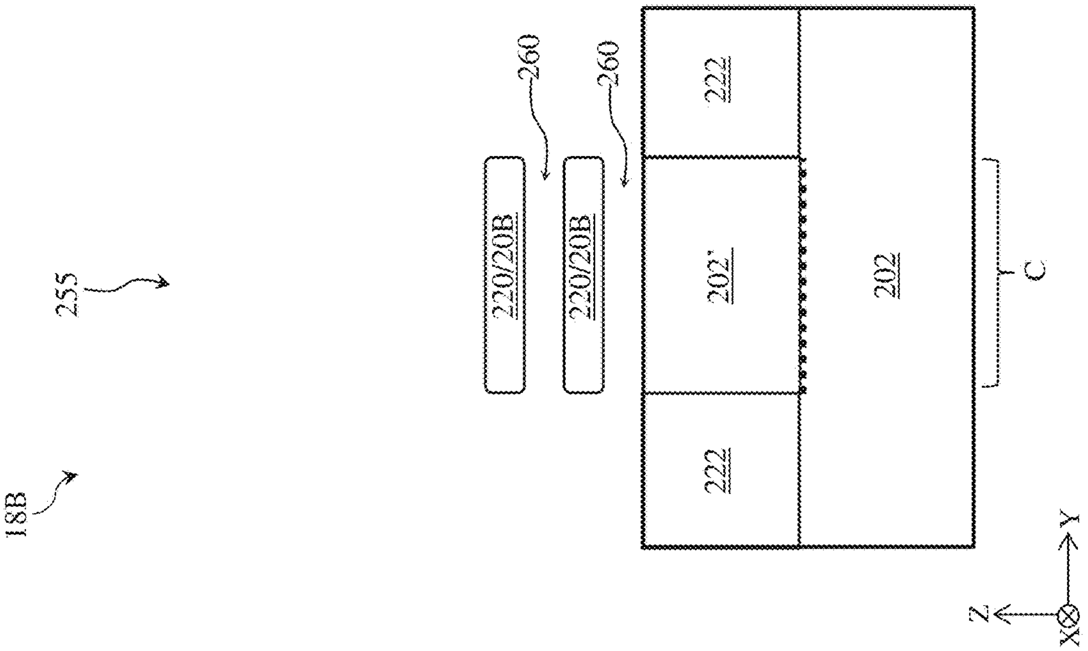
Figure 5A:
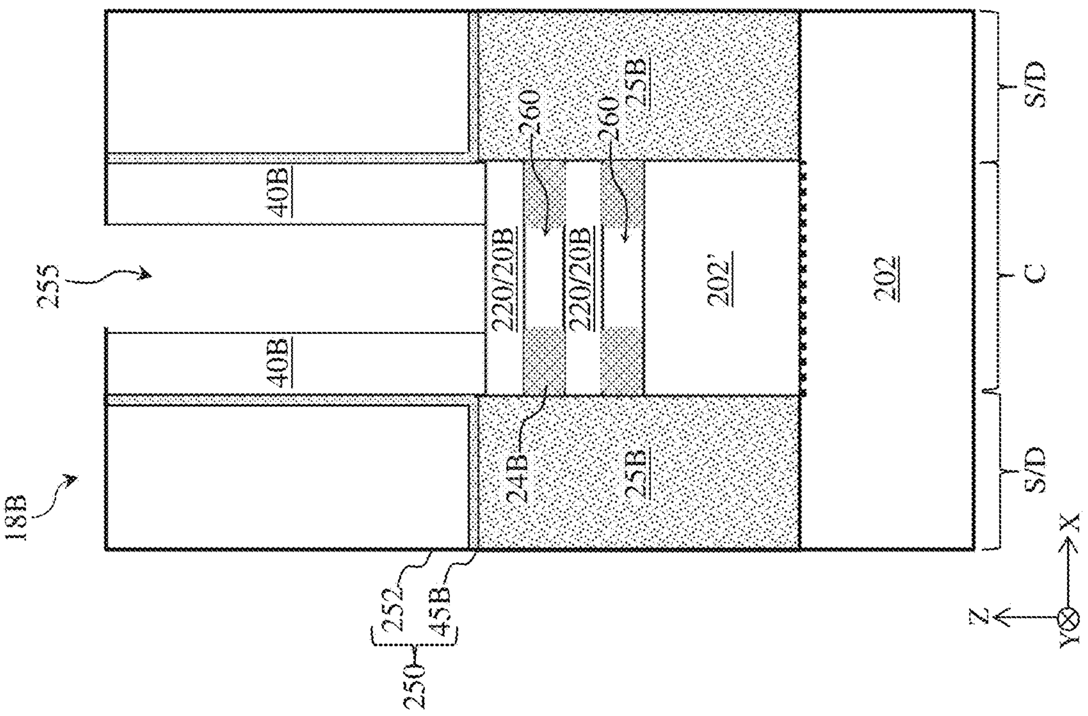

Turning to FIG. 2, FIG. 5A, and FIG. 5B, method 100 at block 115 can include performing a channel release process. For example, semiconductor layers 215 exposed by gate opening 255 are selectively removed to form air gaps 260 between semiconductor layers 220 and between semiconductor layers 220 and mesa 202', thereby suspending semiconductor layers 220 in channel region C. In the depicted embodiment, two suspended semiconductor layers 220 are vertically stacked along the z-direction and provide two channels through which current can flow between epitaxial source/drains 25B. Suspended semiconductor layers 220 are thus referred to hereafter as channel layers 20B. In embodiments where stacked device structure 10 is formed of FinFETs, planar transistors, or other types of transistors, such as where transistor 18B may be a FinFET, the channel release process can be omitted from method 100.

In some embodiments, the channel release process includes an etching process that selectively etches semiconductor layers 215 with minimal to no etching of semiconductor layers 220, mesa 202', gate spacers 40B, inner spacers 24B, isolation feature 222, dielectric layer 250, or a combination thereof. In some embodiments, an etchant is selected for the etch process that etches silicon germanium (i.e., semiconductor layers 215) at a higher rate than silicon (i.e., semiconductor layers 220) and dielectric materials (i.e., gate spacers 40B, inner spacers 24B, isolation feature 222, dielectric layer 250, etc.) (i.e., the etchant has a high etch selectivity with respect to silicon germanium). The etching process is a dry etch, a wet etch, other suitable etching process, or a combination thereof. In some embodiments, before performing the etching process, an oxidation process converts semiconductor layers 215 into semiconductor oxide features (e.g., silicon germanium oxide), and the etching process then removes the semiconductor oxide features. In some embodiments, during and/or after removing semiconductor layers 215, an etching process is performed to modify a profile of semiconductor layers 220 to achieve target dimensions and/or target shapes for channel layers 20B, such as cylindrical-shaped channel layers (e.g., nanowires), rectangular-shaped channel layers (e.g., nanobars), sheet-shaped channel layers (e.g., nanosheets), etc.

Turning to FIG. 2, FIGS. 6A-11A, and FIGS. 6B-11B, method 100 at block 120 includes forming a gate stack in gate opening 255. The gate stack includes gate dielectric 32B (e.g., at least one dielectric gate layer, such as a high-k dielectric layer) and gate electrode 34B (e.g., at least one electrically conductive gate layer, such as a work function layer and/or a bulk metal layer). The gate stack fills gate opening 255 and, in the depicted embodiment, air gaps 260 (see FIG. 11A and FIG. 11B). For example, the gate stack is disposed between channel layers 20B and between channel layers 20B and mesa 202'. In the X-Z plane (FIG. 11A), the gate stack is disposed between gate spacers 40B and between inner spacers 24B. In the Y-Z plane (FIG. 11B), the gate stack at least partially surrounds (e.g., encircles) channel layers 20B. The gate stack may include numerous other layers, such as a capping layer, an interface layer, a diffusion layer, a barrier layer, a hard mask layer, or a combination thereof. The gate stack and gate spacers 40B are collectively referred to as gate structure 30B.

Figure 6B:
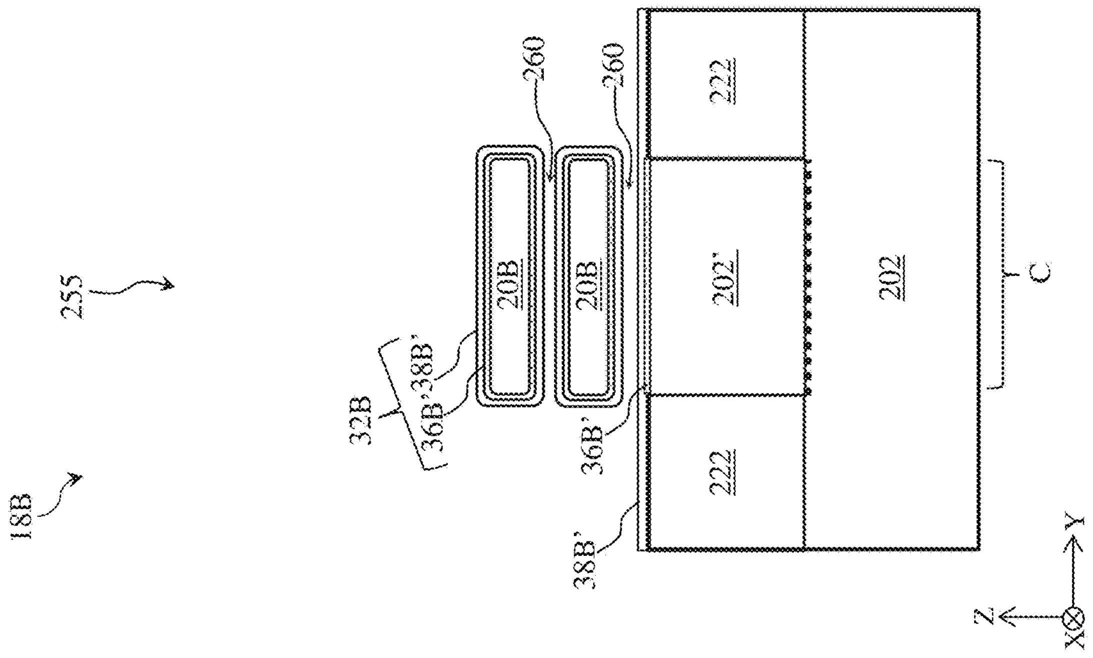
Figure 6A:
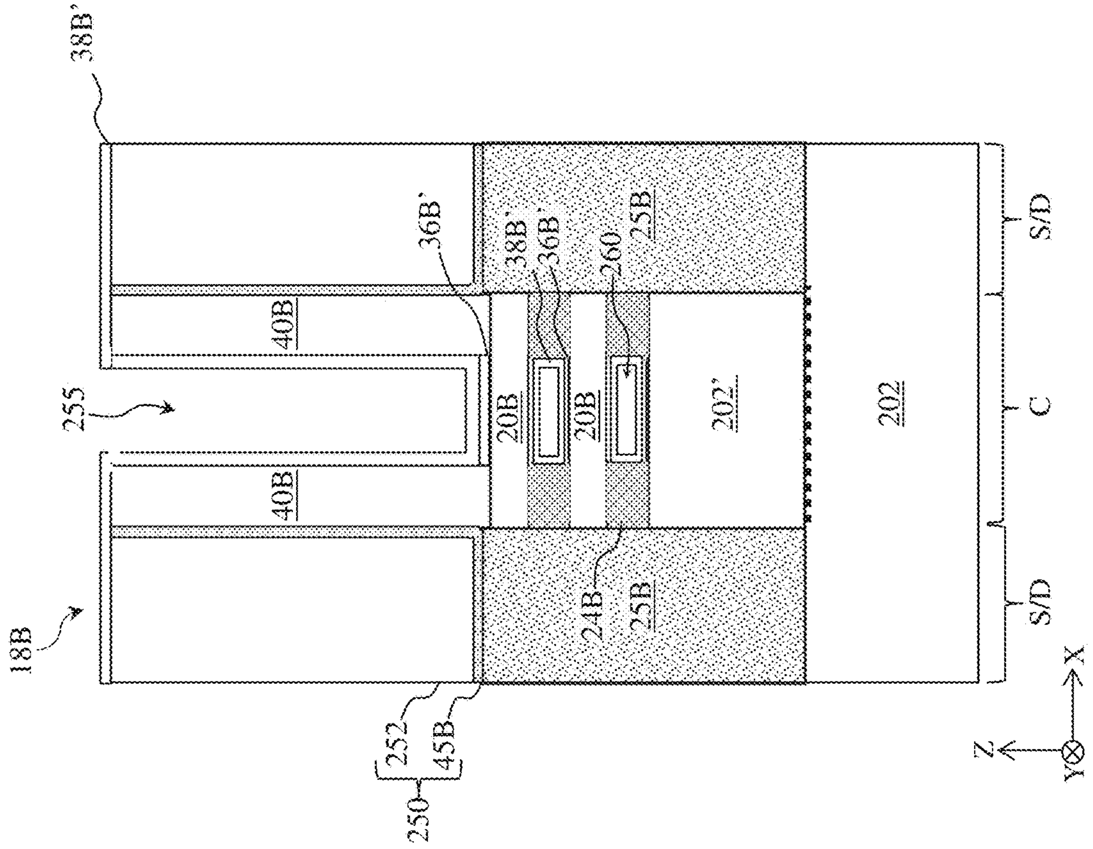

Referring to FIG. 2, FIG. 6A, and FIG. 6B, method 100 at block 125 includes forming gate dielectric 32B in gate opening 255 and over channel layers 20B. In the depicted embodiment, gate dielectric 32B includes interfacial layer 36B' and gate dielectric layer 38B'. Interfacial layer 36B' partially fills gate opening 255 (including air gaps 260) and is formed on semiconductor surfaces, such that interfacial layer 36B' is between channel layers 20B and gate dielectric layer 38B' and between mesa 202' and gate dielectric layer 38B'. In the X-Z plane, interfacial layer 36B' covers top surfaces of channel layers 20B, bottom surfaces of channel layers 20B, and a top surface of mesa 202'. In the Y-Z plane, interfacial layer 36B' surrounds channel layers 20B and covers the top surface of mesa 202'. Interfacial layer 36B' is formed by thermal oxidation, chemical oxidation, atomic layer deposition (ALD), chemical vapor deposition (CVD), other suitable process, or a combination thereof.

Interfacial layer 36B' includes a dielectric material, such as $SiO_2$, $SiGeO_x$, HfSiO, SiON, other dielectric material, or a combination thereof. In some embodiments, interfacial layer 36B' is a group IV-based oxide layer, which generally refers to an oxide of a group IV-based material (i.e., a material that includes at least one group IV element, such as Si, Ge, C, etc.). In some embodiments, interfacial layer 36B' is a group III-V-based oxide layer, which generally refers to an oxide of a group III-V-based material (i.e., a material that includes at least one group III element, such as Al, Ga, In, B, etc., and at least one group V element, such as N, P, As, Sb, etc.). A thickness of interfacial layer 36B' is less than a thickness of gate dielectric layer 38B'. In some embodiments, a thickness of interfacial layer 36B' is about 0.5 nm to about 2 nm. In the depicted embodiment, interfacial layer 36B' has a substantially uniform thickness.

Gate dielectric layer 38B' partially fills gate opening 255 (including air gaps 260) and is formed on interfacial layer 36B', gate spacers 40B, inner spacers 24B, isolation feature 222, and dielectric layer 250. In the X-Z plane, gate dielectric layer 38B' has a u-shaped profile in a top portion of gate opening 255. In the Y-Z plane, gate dielectric layer 38B' surrounds channel layers 20B. Gate dielectric layer 38B' has a substantially uniform thickness. In some embodiments, a thickness of gate dielectric layer 38B' is about 1 nm to about 5 nm. Gate dielectric layer 38B' is formed by ALD, CVD, physical vapor deposition (PVD), an oxide-based deposition process, other suitable process, or a combination thereof.

Gate dielectric layer 38B' includes a high-k dielectric material, which generally refers to dielectric materials having a dielectric constant that is greater than a dielectric constant of silicon dioxide (k≈3.9), such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $LaO_3$, $La_2O_3$, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, $HfO_2$—$Al_2O_3$, other high-k dielectric material, or a combination thereof. For example, gate dielectric layer 38B' is a hafnium-based oxide (e.g., $HfO_2$) layer or a zirconium-based oxide (e.g., $ZrO_2$) layer. In some embodiments, gate dielectric layer 38B' has a multilayer structure.

Referring to FIG. 2, FIGS. 7A-9A, and FIGS. 7B-9B, dipole engineering is implemented after forming gate dielectric 32B to modulate a threshold voltage of transistor 18B. For example, processing associated with block 130, block 135, and block 140 of method 100 can form dipoles in gate dielectric 32B that shift the threshold voltage of transistor 18B. The dipoles can form at an interface of gate dielectric layer 38B' and interfacial layer 36B' (i.e., at a high-k/interfacial interface of the gate stack), and parameters of the processing associated with block 130, block 135, and block 140 of method 100 can be tuned to achieve desired threshold voltage shifts in and/or desired threshold voltage characteristics of transistor 18B. In the depicted embodiment, n-dipole dopant is incorporated into gate dielectric 32B to change (e.g., reduce) the threshold voltage of transistor 18B, which is configured as an n-type transistor. As described below, the disclosed dipole engineering technique is a low temperature, threshold voltage tuning process that is particularly advantageous when fabricating stacked transistor structures.

Figure 7B:
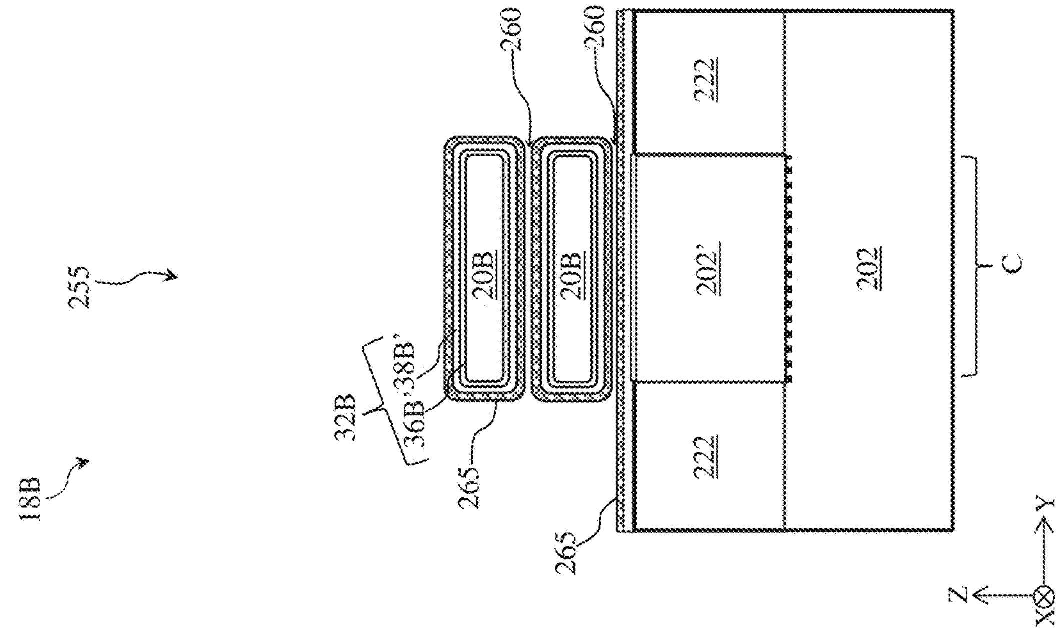
Figure 7A:
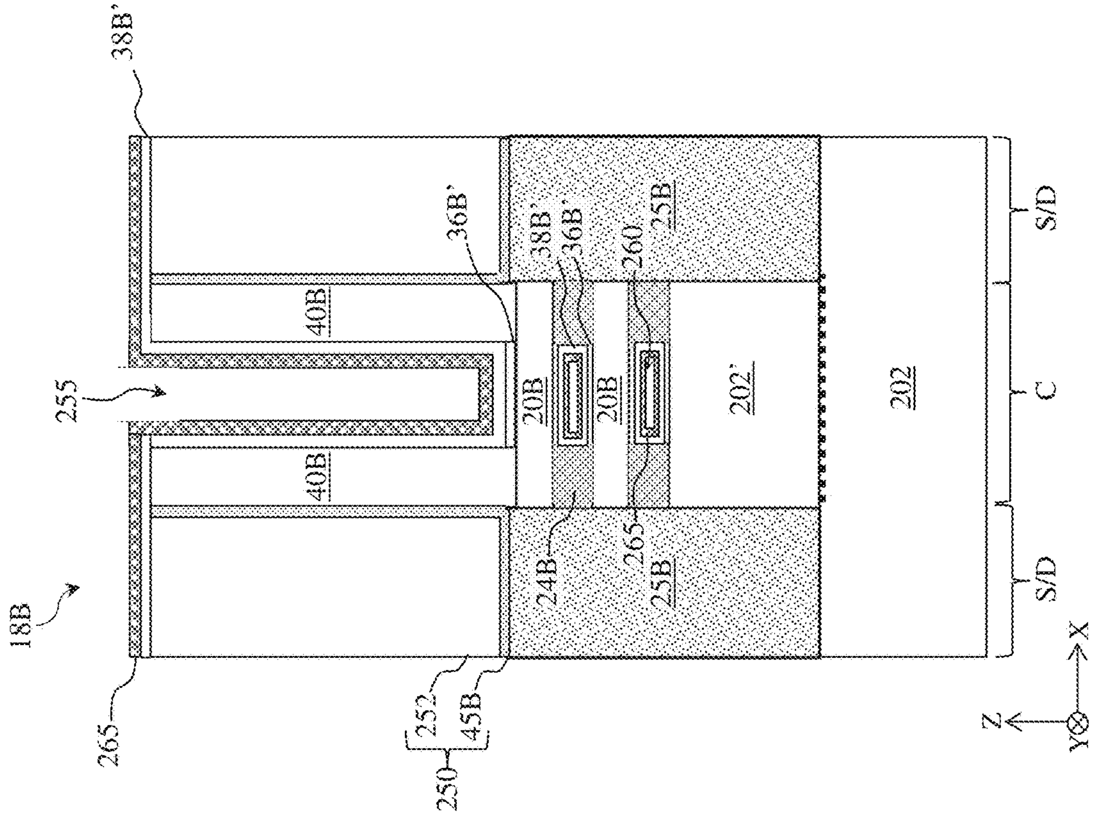

Referring to FIG. 2, FIG. 7A, and FIG. 7B, method 100 at block 130 includes forming a dipole dopant source layer 265 over gate dielectric 32B. Dipole dopant source layer 265 is formed on gate dielectric layer 38B' and partially fills gate opening 255 (including air gaps 260). In the X-Z plane, dipole dopant source layer 265 covers gate dielectric layer 38B' and has a u-shaped profile in a top portion of gate opening 255. In the Y-Z plane, dipole dopant source layer 265 covers gate dielectric layer 38B' and surrounds channel layers 20B. In some embodiments, dipole dopant source layer 265 fills air gaps 260. Dipole dopant source layer 265 is formed by ALD, CVD, other suitable process, or a combination thereof.

Dipole dopant source layer 265 is a dielectric layer that includes n-dipole dopant(s) that can be driven into gate dielectric 32B to change a threshold voltage of transistor 18B. For example, dipole dopant source layer 265 includes an n-dipole dopant (e.g., a metal) and oxygen, nitrogen, carbon, or a combination thereof (e.g., a non-metal). The n-dipole dopant is selected to provide dipole dopant source layer 265 with metal-non-metal bonds having a bond dissociation energy that is less than a bond dissociation energy of lanthanum-non-metal bonds. For example, dipole dopant source layer 265 includes metal-oxygen bonds (where the metal is the n-dipole dopant) having a bond dissociation energy that is less than a bond dissociation energy of lanthanum-oxygen bonds of a lanthanum oxide layer (where lanthanum is the n-dipole dopant). Strontium (Sr), erbium (Er), magnesium (Mg), or a combination thereof are examples of n-dipole dopants that can provide dipole dopant source layer 265 with metal-non-metal bonds having a bond dissociation energy that is less than a bond dissociation energy of lanthanum-oxygen bonds. In some embodiments, where the n-dipole dopant is strontium and dipole dopant source layer 265 is a strontium oxide layer (e.g., an SrO layer), a bond dissociation energy of strontium-oxygen bonds is about 55% less than a bond dissociation energy of lanthanum-oxygen bonds of a lanthanum oxide layer (e.g., a $La_2O_3$ layer). In some embodiments, where the n-dipole dopant is erbium and dipole dopant source layer 265 is an erbium oxide layer (e.g., an $Er_2O_3$ layer), a bond dissociation energy of erbium-oxygen bonds is about 26% less than a bond dissociation energy of lanthanum-oxygen bonds of a lanthanum oxide layer. In some embodiments, where the n-dipole dopant is magnesium and dipole dopant source layer 265 is a magnesium oxide layer (e.g., an MgO layer), a bond dissociation energy of magnesium-oxygen bonds is about 67% less than a bond dissociation energy of lanthanum-oxygen bonds of a lanthanum oxide layer.

As noted above, when fabricating a stacked transistor structure using a sequential fabrication scheme, a bottom transistor (e.g., transistor 18A) is subjected to processing, including thermal processes thereof, used to fabricate a top transistor (e.g., transistor 18B). Challenges arise when high temperatures are used to fabricate the top transistor. For example, when a lanthanum oxide layer (e.g., a $La_2O_3$ layer) is implemented as a dipole dopant source layer for threshold voltage tuning, lanthanum is the n-dipole dopant. Because lanthanum-oxygen bonds have a high bond dissociation energy (e.g., 799 $\Delta H_{f298}$, kJ/mol), thermal drive-in temperatures of at least 600° C. are needed to break lanthanum-oxygen bonds to drive-in (diffuse) lanthanum into an underlying gate dielectric. However, high temperatures (i.e., greater than 600° C.) can negatively impact electrical performance and/or reliability of the bottom transistor, for example, by undesirably modifying doping profiles of the bottom transistor, thereby undesirably altering its threshold voltage and/or drive current ($I_{on}$). Electrical performance and/or reliability of the bottom transistor is thus degraded by top transistor fabrication.

The present dipole engineering technique overcomes such challenges by incorporating n-dipole dopant(s) into dipole dopant source layer 265 that provides metal-non-metal bonds having lower bond dissociation energies and thus allow for lower temperatures for driving n-dipole dopant into an adjacent gate dielectric. For example, dipole dopant source layer 265 includes an oxide, a nitride, a carbide, or a combination thereof of an n-dipole dopant that can be driven/diffused into gate dielectric 32B at a temperature less than 600° C., such as strontium, erbium, magnesium, or a combination thereof. In some embodiments, dipole dopant source layer 265 includes n-dipole dopant that can be driven into gate dielectric 32B at sub-600° C. temperatures to reduce a threshold voltage of transistor 18B (e.g., an n-type transistor). In some embodiments, to ensure minimal impact to other device features and/or devices (e.g., a bottom transistor), n-dipole dopant that can be diffused into gate dielectric 32B with thermal drive-in temperatures less than about 500° C., such as about 300° C. to about 500° C., are used for threshold voltage modification, such as strontium, erbium, magnesium, other n-dipole dopant that can be driven into gate dielectric 32B at sub-500° C. temperatures, or a combination thereof. In some embodiments, dipole dopant source layer 265 is an oxide of strontium, erbium, magnesium, or a combination thereof, each of which can be diffused into gate dielectric 32B using temperatures of about 300° C. to about 500° C. In embodiments where transistor 18B is configured as a p-type transistor, low temperature thermal drive-in of the disclosed n-dipole dopant into gate dielectric 32B may increase the threshold voltage of transistor 18B.

Threshold voltage tuning of n-type transistors, such as transistor 18B, can depend on dipole moment, dopant electronegativity, ionic radii, or a combination thereof. Accordingly, some n-dipole dopants can provide larger threshold voltage tuning windows, and thus greater threshold voltage reduction, than others. For example, a strontium oxide layer provides greater threshold voltage reductions than a lanthanum oxide layer, and thus, strontium is particularly useful as an n-dipole dopant for low temperature threshold voltage tuning. When compared to lanthanum, such differences in threshold voltage reduction can arise because a dipole moment of strontium is greater than a dipole moment of lanthanum (e.g., by about 20%), dopant radii of strontium is greater than dopant radii of lanthanum, an electronegativity of strontium is less than an electronegativity of lanthanum, other factors, or a combination thereof.

In some embodiments, the n-dipole dopant is strontium, and dipole dopant source layer 265 includes strontium and oxygen, nitrogen, carbon, or a combination thereof. For example, dipole dopant source layer 265 can be a strontium oxide layer, a strontium nitride layer, or a strontium carbide layer. In some embodiments, the n-dipole dopant is erbium, and dipole dopant source layer 265 includes erbium and oxygen, nitrogen, carbon, or a combination thereof. For example, dipole dopant source layer 265 is an erbium oxide layer, an erbium nitride layer, or an erbium carbide layer. In some embodiments, the n-dipole dopant is magnesium, and dipole dopant source layer 265 includes magnesium and oxygen, nitrogen, carbon, or a combination thereof. For example, dipole dopant source layer 265 is a magnesium oxide layer, a magnesium nitride layer, or a magnesium carbide layer. In some embodiments, dipole dopant source layer 265 includes a metal (e.g., strontium, erbium, magnesium, or a combination thereof) and a non-metal (e.g., oxygen, nitrogen, carbon, or a combination thereof). The present disclosure also contemplates other n-dipole dopants so long as such n-dipole dopants can be driven into gate dielectric 32B at sub-600° C. temperatures and/or provide dipole dopant source layer 265 with dipole dopant-non-metal bonds, such as dipole dopant-oxygen bonds, having a bond dissociation energy that is less than a bond dissociation energy of lanthanum-oxygen bonds.

Dipole dopant source layer 265 has a substantially uniform thickness. In some embodiments, a thickness of dipole dopant source layer 265 is about 0.3 nm to about 1.5 nm. If dipole dopant source layer 265 is too thin (such as less than 0.3 nm), it may not uniformly cover gate dielectric 32B, which can affect uniformity of dipole engineering of gate dielectric 32B and/or uniformity of threshold voltage tuning of transistor 18B (i.e., non-uniform threshold voltage tuning may occur). If dipole dopant source layer 265 is too thick (such as greater than 1.5 nm), it may be difficult to remove and thus undesirably remain in the gate stack. For example, if too thick, remnants of dipole dopant source layer 265 may remain between channel layers 20B, such that air gaps 260 remain partially filled by dipole dopant source layer 265. This can affect subsequent fabrication, for example, by leaving insufficient space for a gate electrode (such as a work function metal and/or a bulk metal layer) to fill gate opening 255 and/or cause transistor 18B to have different electrical characteristics than intended (e.g., different threshold voltage). Further, a composition and a thickness of dipole dopant source layer 265 can be designed based on a desired amount of threshold voltage tuning. For example, a thicker dipole dopant source layer 265 can provide greater threshold voltage changes (e.g., greater threshold voltage reductions) in transistor 18B. In some embodiments, using the disclosed n-dipole dopant materials, such as SrO, $Er_2O_3$, or MgO, and the disclosed thicknesses, a threshold voltage of transistor 18B can be adjusted down (when configured as an n-type transistor) or up (when configured as a p-type transistor) by about 30 mV to about 180 mV. In some embodiments, dipole dopant source layer 265 has a multi-layer structure, where a composition and a thickness of each layer can be designed to achieve desired threshold voltage tuning.

Figure 8B:
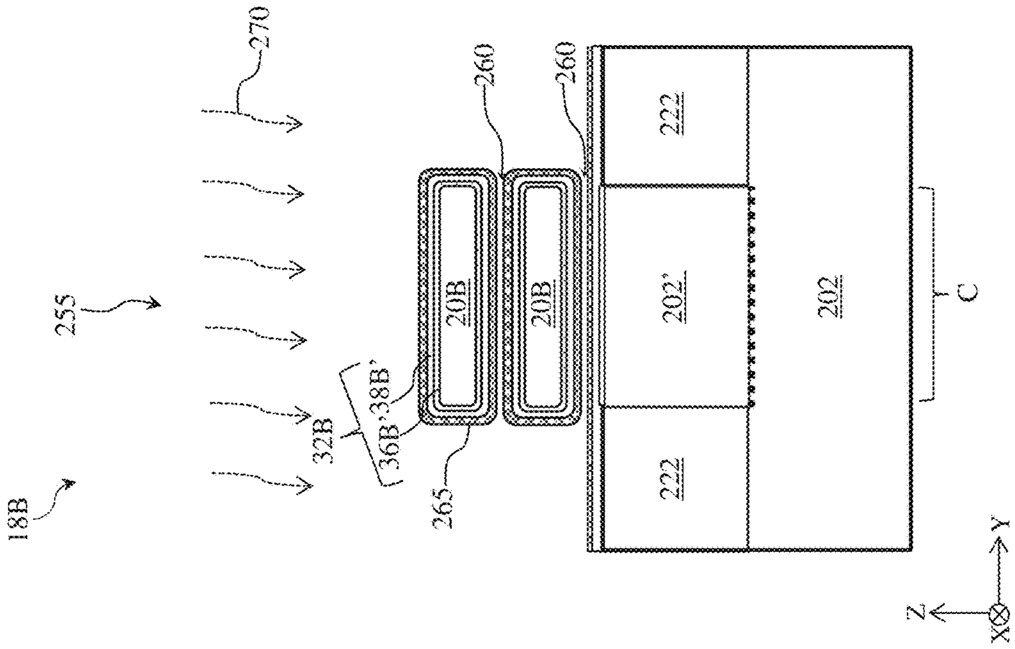
Figure 8A:
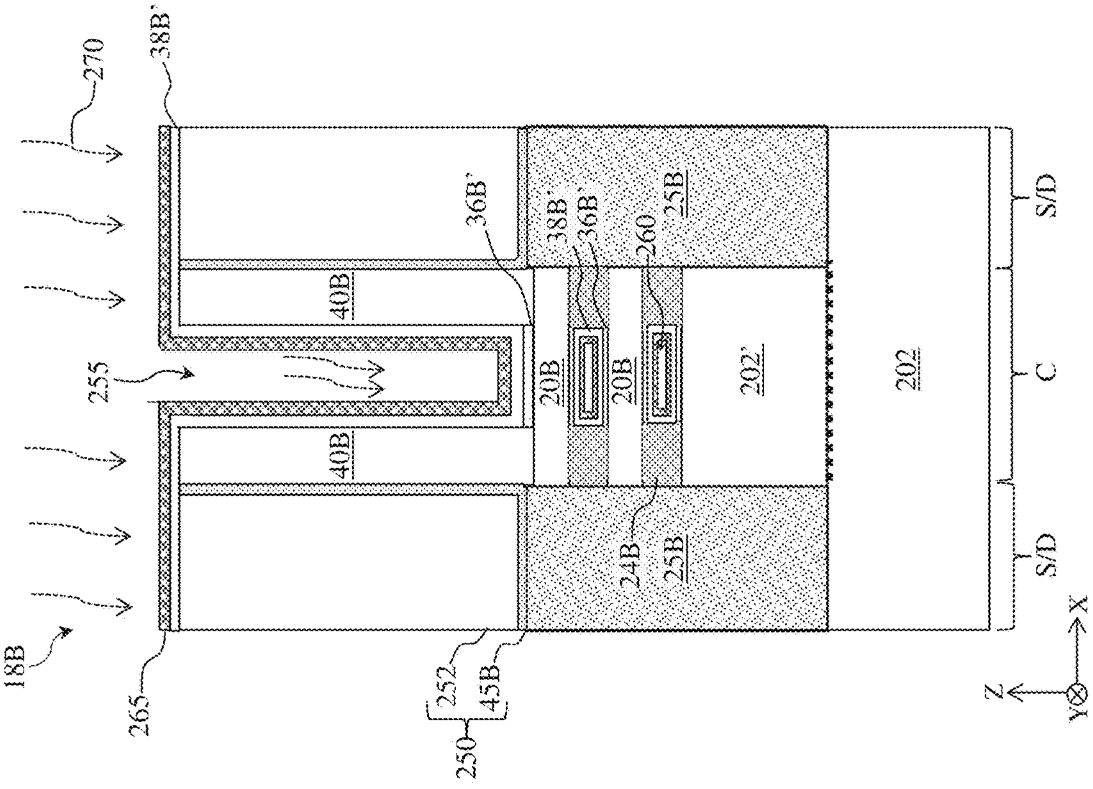

Referring to FIG. 2, FIG. 8A, and FIG. 8B, method 100 at block 135 includes performing a thermal drive-in process 270 that drives (diffuses) dopant from dipole dopant source layer 265 into gate dielectric 32B. For example, thermal drive-in process 270 drives n-dipole dopant from dipole dopant source layer 265 into gate dielectric 32B, such as into gate dielectric layer 38B' and/or interfacial layer 36B'. A drive-in temperature of thermal drive-in process 270 is less than 600° C., such as about 300° C. to about 500° C. Thermal drive-in process 270 can be an annealing process, such as a rapid thermal annealing (RTA), a millisecond annealing (MSA), a microsecond annealing (pSA), a microwave annealing, a laser annealing, a spike annealing, a soak annealing, a furnace annealing, other suitable annealing process, or a combination thereof. In some embodiments, thermal drive-in process 270 is performed in an inert gas ambient, including, for example, argon (Ar), helium (He), nitrogen ($N_2$), other inert gas, or a combination thereof. For example, thermal drive-in process 270 can be an annealing process performed at a temperature about 300° C. to about 500° C. in an $N_2$, Ar, He, or a mixture thereof ambient for about 10 seconds to about 180 seconds. The disclosed thermal drive-in temperatures ensure that thermal drive-in process 270 does not adversely affect existing structures and features of transistor 18B and/or of a stacked transistor structure to which transistor 18B belongs, such as transistor 18A, and is yet sufficient to cause n-dipole dopant to migrate (or diffuse) into gate dielectric 32B. As noted above, thermal drive-in process 270 can implement sub-600° C. temperatures (and, in particular, temperatures of about 300° C. to about 500° C.) because dipole dopant source layer 265 includes n-dipole dopant (e.g., Sr, Er, Mg, etc.) that provides it with metal-non-metal bonds (e.g., metal-oxygen bonds)

having a bond dissociation energy that is less than a bond dissociation energy of lanthanum-oxygen bonds.

Figure 9B:
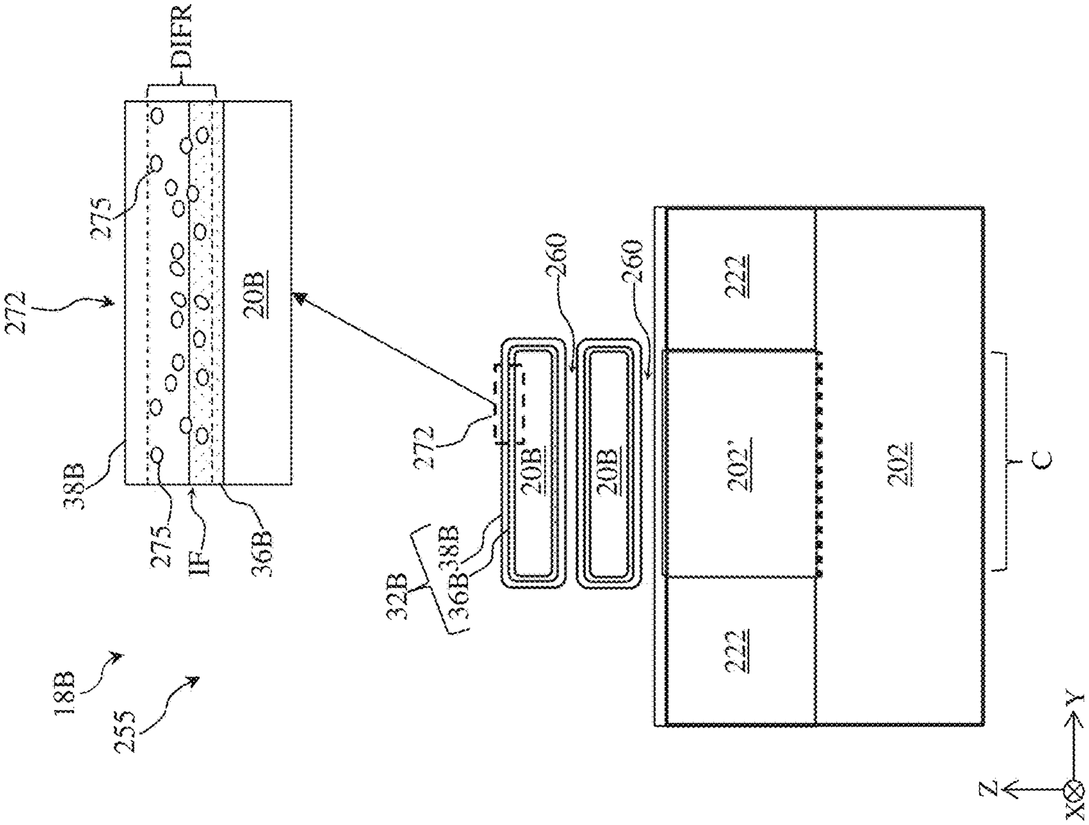
Figure 9A:
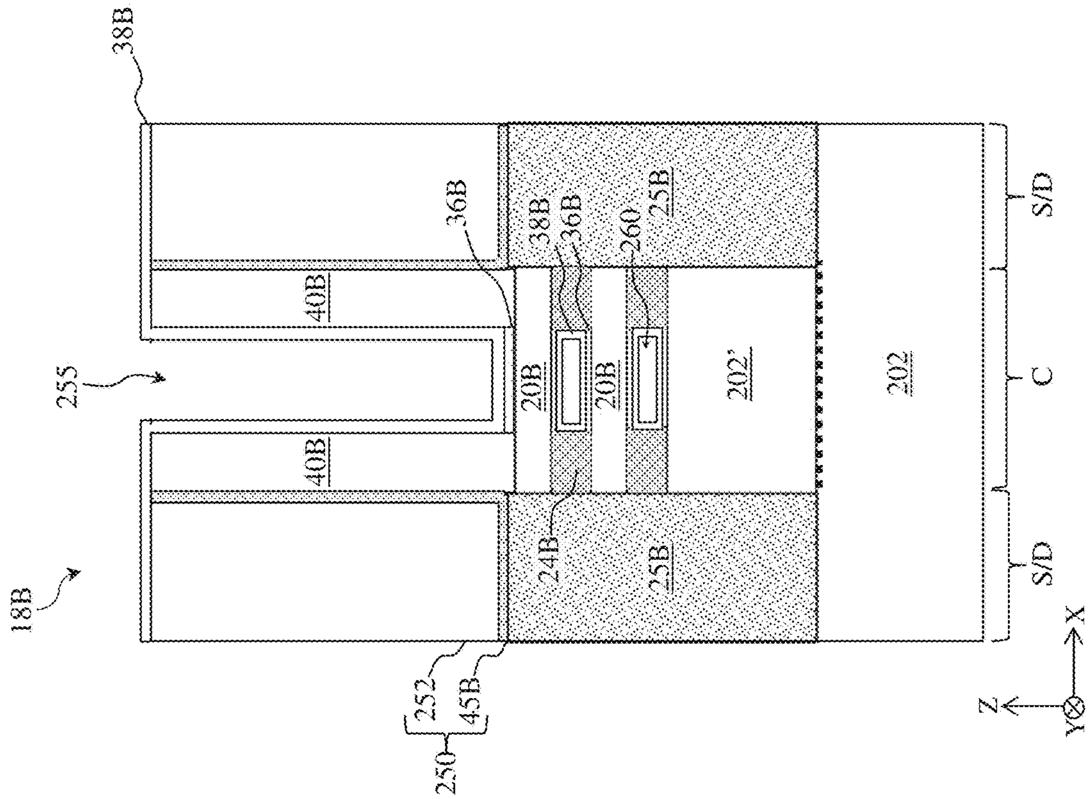

After thermal drive-in process 270, because n-dipole dopant is driven into gate dielectric layer 38B' and/or interfacial layer 36B', gate dielectric layer 38B' becomes gate dielectric layer 38B (i.e., a doped gate dielectric layer), as depicted in FIG. 9A and FIG. 9B. For example, gate dielectric layer 38B is a high-k dielectric layer, such as a hafnium-based oxide (e.g., $HfO_2$) layer or a zirconium-based oxide (e.g., $ZrO_2$) layer, that includes strontium, erbium, magnesium, or a combination thereof. In some embodiments, n-dipole dopant is also diffused into interfacial layer 36B', such that interfacial layer 36B' becomes interfacial layer 36B (i.e., a doped interfacial layer), as depicted in FIG. 9A and FIG. 9B. For example, interfacial layer 36B may be a dielectric layer, such as a group IV-based oxide (e.g., $SiO_2$) layer or a group III-V-based oxide layer, that further includes strontium, erbium, magnesium, or a combination thereof. In some embodiments, gate dielectric layer 38B and/or interfacial layer 36B are substantially free of lanthanum (i.e., gate dielectric 32B does not include lanthanum therein).

Referring to FIG. 2, FIG. 9A, and FIG. 9B, method 100 at block 140 includes removing dipole dopant source layer 265. By removing dipole dopant source layer 265, the disclosed low-temperature dipole engineering process provides volume-free threshold voltage tuning. In other words, the low-temperature dipole engineering process can modulate threshold voltage of transistor 18B by driving n-dipole dopant into gate dielectric 32B, but material layers used for such threshold voltage modulation do not remain and thus do not consume any volume of a final gate stack, such that dimensions of gate opening 255 and/or air gaps 260 are maximized for subsequent gate electrode formation. In some embodiments, an etching process selectively removes dipole dopant source layer 265 with respect to gate dielectric layer 38B. For example, the etching process substantially removes dipole dopant source layer 265 but does not remove, or does not substantially remove, gate dielectric layer 38B. In some embodiments, an etchant is selected for the etching process that etches dipole dopant source layer 265 (e.g., an SrO layer, an $Er_2O_3$ layer, an MgO layer, or another dielectric layer that includes strontium, erbium, magnesium, other n-dipole dopant, or a combination thereof) at a higher rate than gate dielectric layer 38B (e.g., an $HfO_2$ layer, a $ZrO_2$ layer, or another high-k dielectric material that includes strontium, erbium, magnesium, other n-dipole dopant, or a combination thereof). The etching process is a dry etch, a wet etch, other suitable etch, or a combination thereof.

As shown in an enlarged view of a portion of gate dielectric 32 corresponding with a boxed region 272 in FIG. 9B, n-dipole dopants 275 diffused into an inner portion of gate dielectric layer 38B (i.e., towards and/or near interfacial layer 36B). In the depicted embodiment, n-dipole dopant 275 is distributed in gate dielectric layer 38B and interfacial layer 36B along an interface IF therebetween (i.e., along a high-k/interfacial interface). Accordingly, gate dielectric 32B has a doped interface region DIFR that includes a portion of gate dielectric layer 38B and a portion of interfacial layer 36B. In some embodiments, a thickness of doped interface region DIFR (i.e., where n-dipole dopant is distributed in gate dielectric 32B) is about 1 Å to 10 Å. If the thickness is too small (such as less than 1 Å), any voltage threshold modification of transistor 18B provided by n-dipole dopant (i.e., a threshold voltage tuning effect of n-dipole dopant) may be negligible and/or too weak. If the thickness is too large (such as greater than 30 Å), the threshold voltage tuning effect of n-dipole dopant may be too strong and cause undesirable side effects, such as degraded mobility in channel layers 20B.

A thickness of gate dielectric layer 38B' is designed so that n-dipole dopant can effectively permeate through gate dielectric layer 38B' to the high-k/interfacial interface IF. Further, a composition and/or a thickness of dipole dopant source layer 265, a composition and/or a thickness of gate dielectric layer 38B', and parameters of thermal drive-in process 270 (e.g., drive-in temperature, time, ambient, pressure, etc.) can be configured to provide doped interface region DIFR with a desired dipole dopant profile along a thickness T of gate dielectric 32B (FIG. 12). Turning to FIG. 12, doped interface region DIFR has a bell-shaped dipole dopant profile A that extends from a depth d1 in gate dielectric 32B (located in gate dielectric layer 38B) to a depth d3 in gate dielectric 32B (located in interfacial layer 36B) and that spans high-k/interfacial interface IF at a depth d2. For example, a concentration of n-dipole dopant increases from a dopant concentration c1 at depth d1 to a dopant concentration c2 (which is a peak, maximum dopant concentration) at depth d2 and then decreases from dopant concentration c2 at depth d2 to dopant concentration c1 at depth d3. A peak of dipole dopant profile A of doped interface region DIFR is thus located at high-k/interfacial interface IF, and the peak of dipole dopant profile A corresponds with a location in gate dielectric 32B having a highest dipole dopant concentration. In such example, n-dipole dopant is distributed uniformly in gate dielectric layer 38B and interfacial layer 36B. In some embodiments, the dopant concentration at depth d1 and the dopant concentration at depth d3 are different.

To maximize threshold voltage tuning effect of n-dipole dopant, a peak of a dipole dopant profile of doped interface region DIFR is at high-k/interfacial interface IF±0.5 nm. In other words, in the depicted embodiment, the peak of the dipole dopant profile is located at depth d2±0.5 nm, and a location of the peak of the dipole dopant profile can be between a first depth and a second depth, where a difference between the first depth and the second depth is about 1 nm (i.e., a location of the peak of the dipole dopant profile can be along a depth range (Δd) that is less than about 1 nm). For example, doped interface region DIFR can have a bell-shaped dipole dopant profile B that is similar to dipole dopant profile A, except it is shallower in gate dielectric 32B than dipole dopant profile A, such that a peak of dipole dopant profile B is located in gate dielectric layer 38B at depth d2−0.5 nm. In such example, n-dipole dopant is distributed primarily in gate dielectric layer 38B. In another example, doped interface region DIFR can have a bell-shaped dipole dopant profile C that is similar to dipole dopant profile A, except it is deeper in gate dielectric 32B than dipole dopant profile A, such that a peak of dipole dopant profile C is located in interfacial layer 36B at depth d2+0.5 nm. In such example, n-dipole dopant is distributed primarily in interfacial layer 36B. If the peak of the dipole dopant profile is located greater than 0.5 nm from high-k/interfacial interface IF, any threshold voltage tuning provided by incorporating the dipole dopant may be insignificant and/or insufficient.

Referring to FIG. 2, FIG. 10A, FIG. 10B, FIG. 11A, and FIG. 11B, at block 145 of method 100, gate electrode 34B is formed over gate dielectric 32B. Gate electrode 34B fills a remainder of gate opening 255, and gate electrode 34B includes at least one electrically conductive gate layer. The electrically conductive gate layer includes an electrically conductive material, such as Al, Cu, Ti, Ta, W, Mo, Co, TaN, NiSi, CoSi, TiN, WN, TiAl, TiAlN, TaCN, TaC, TaSiN, other electrically conductive material, or a combination thereof.

Figure 10B:
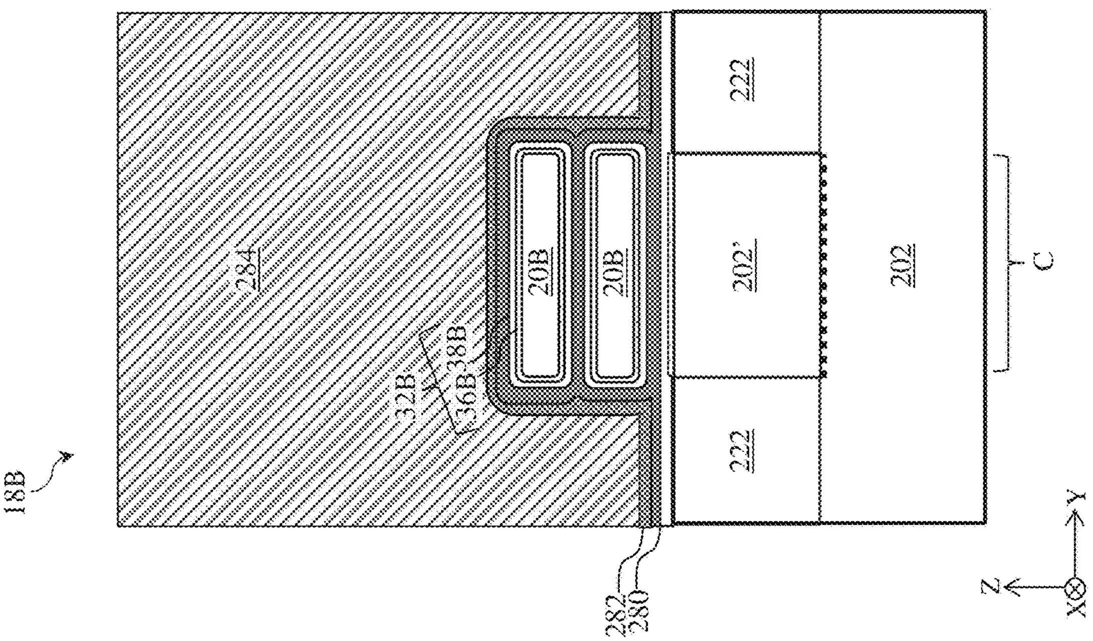
Figure 10A:
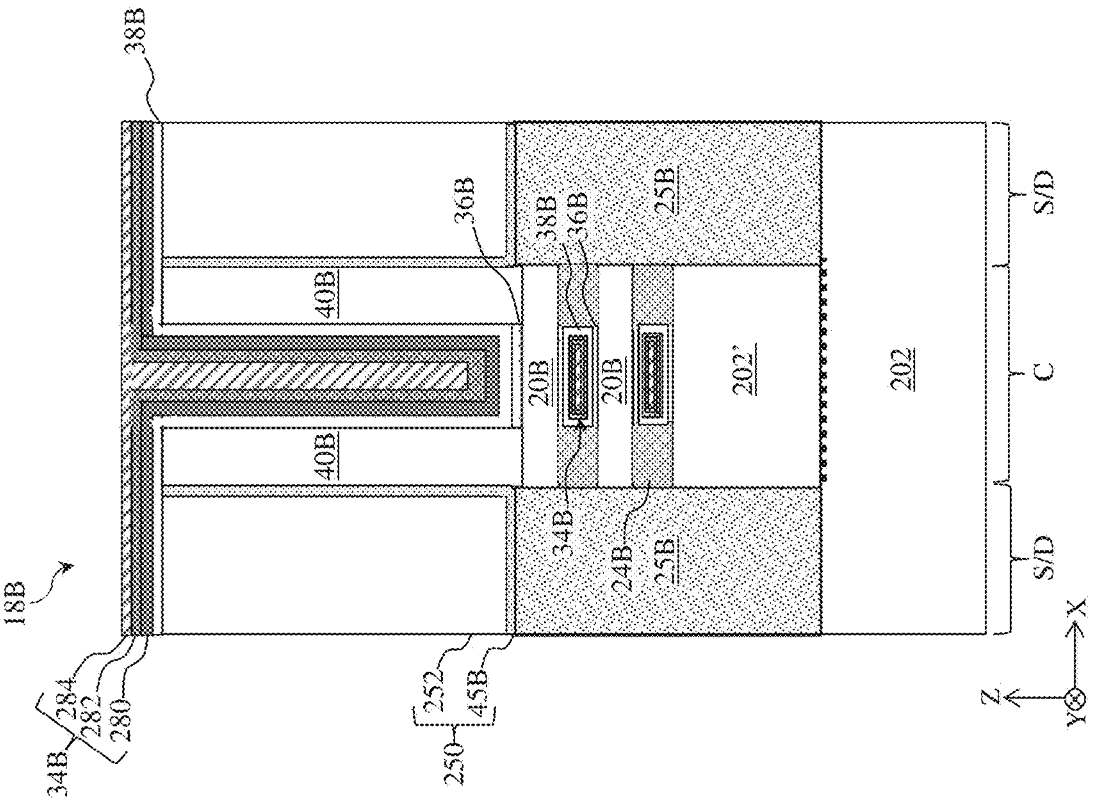

Referring to FIG. 10A and FIG. 10B, in some embodiments, forming gate electrode 34B can include depositing a work function layer 280 over gate dielectric 32B, depositing a barrier layer 282 over work function layer 280, and depositing a bulk (fill) layer 284 over barrier layer 282. Work function layer 280 partially fills gate opening 255, barrier layer 282 partially fills gate opening 255, and bulk layer 284 fills a remainder of gate opening 255. In FIG. 10B, work function layer 280 fills remainders of air gaps 260. In some embodiments, work function layer 280 and barrier layer 282 and/or bulk layer 284 fill remainders of air gaps 260. Work function layer 280 and barrier layer 282 have substantially uniform thicknesses. In some embodiments, each layer of gate electrode 34B (here, work function layer 280, barrier layer 282, and bulk layer 284) has a thickness of about 0.5 nm to about 5 nm. Work function layer 280, barrier layer 282, and bulk layer 284 can be formed by ALD, PVD, CVD, high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable process, or a combination thereof.

Work function layer 280 is a conductive layer tuned to have a desired work function, such as an n-type work function or a p-type work function, depending on a type of transistor 18B. For example, where transistor 18B is configured as an n-type transistor, work function layer 280 can include an n-type work function material, and where transistor 18B is configured as a p-type transistor, work function layer 280 can include a p-type work function material. In some embodiments, work function layer 280 includes Ti, Al, Ag, Mn, Zr, TiC, TiAl, TiAlC, TiAlSiC, TaC, TaCN, TaSiN, TiSiN, TiN, TaN, Ru, Mo, WN, WCN, $ZrSi_2$, $MoSi_2$, $TaSi_2$, $NiSi_2$, TaAl, TaAlC, TaSiAlC, TiAlN, other suitable work function metal(s) and/or alloys thereof, or a combination thereof. In some embodiments, work function layer 280 is free of aluminum.

Bulk layer 284 includes a suitable conductive material, such as Al, W, Cu, Ti, Ta, TiN, TaN, polysilicon, other suitable metal(s) and/or alloys thereof, or a combination thereof. For example, bulk layer 284 is a tungsten layer formed by PVD or CVD. In some embodiments, barrier (blocking) layer 282 is optionally formed (e.g., by ALD) over work function layer 280 before forming bulk layer 284, such that barrier layer 282 is disposed between bulk layer 284 and work function layer 280. In some embodiments, barrier layer 282 includes a material that prevents or eliminates diffusion and/or reaction of constituents between adjacent layers and/or promotes adhesion between adjacent layers, such as between work function layer 280 and bulk layer 284. In some embodiments, barrier layer 282 includes metal and nitrogen, such as titanium nitride, tantalum nitride, tungsten nitride (e.g., $W_2N$), titanium silicon nitride (TiSiN), tantalum silicon nitride (TaSiN), other suitable metal nitride, or a combination thereof.

Figure 11A:
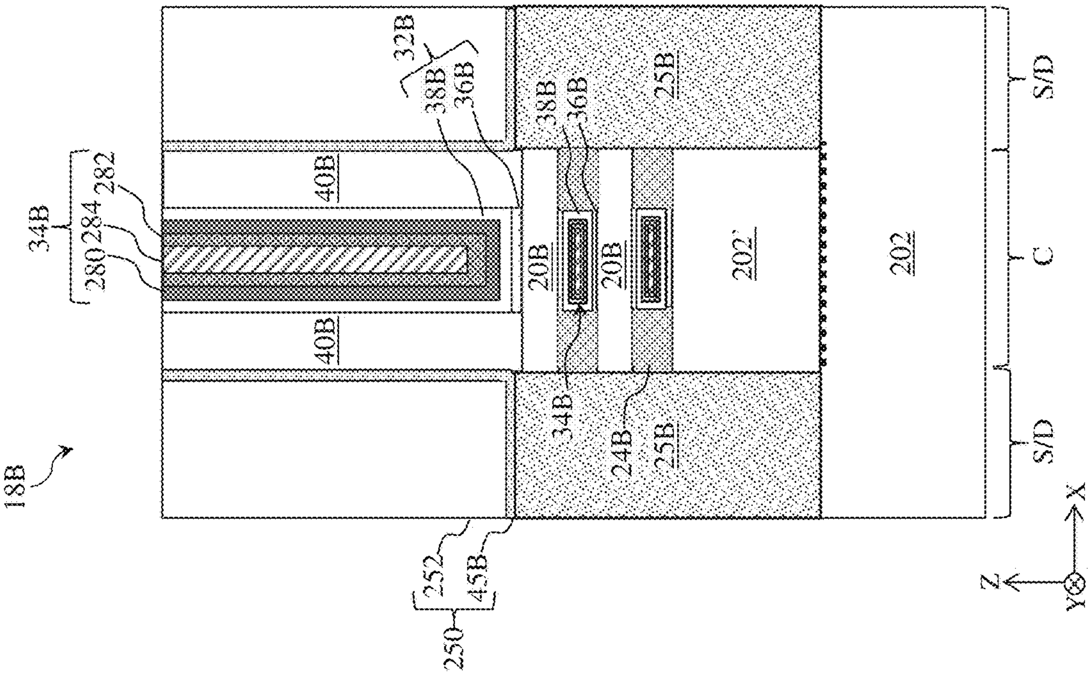
Figure 11B:
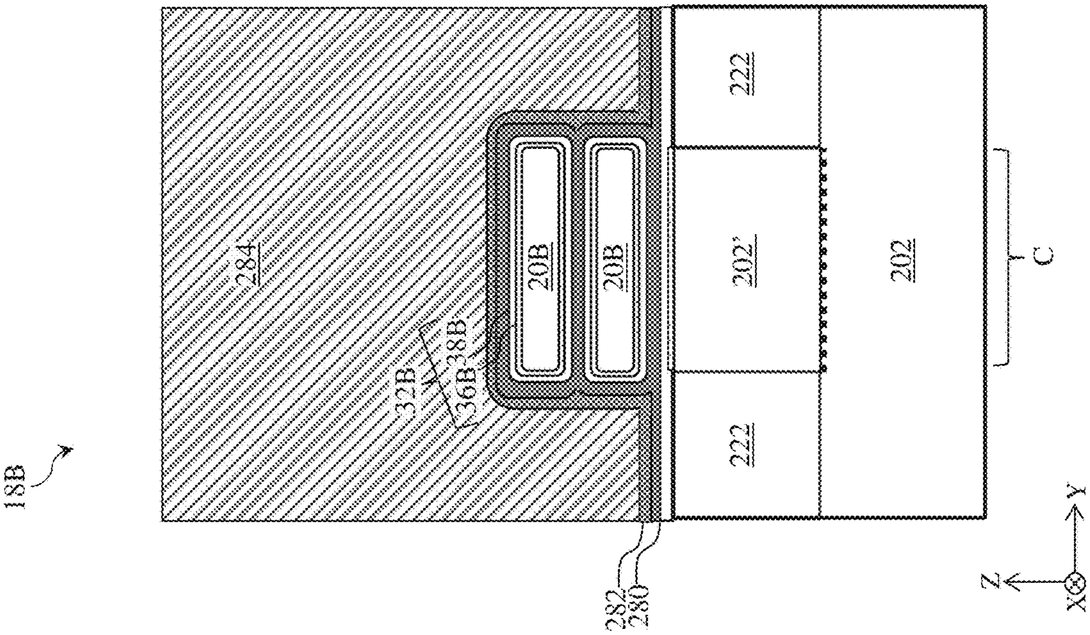
Figure 12:
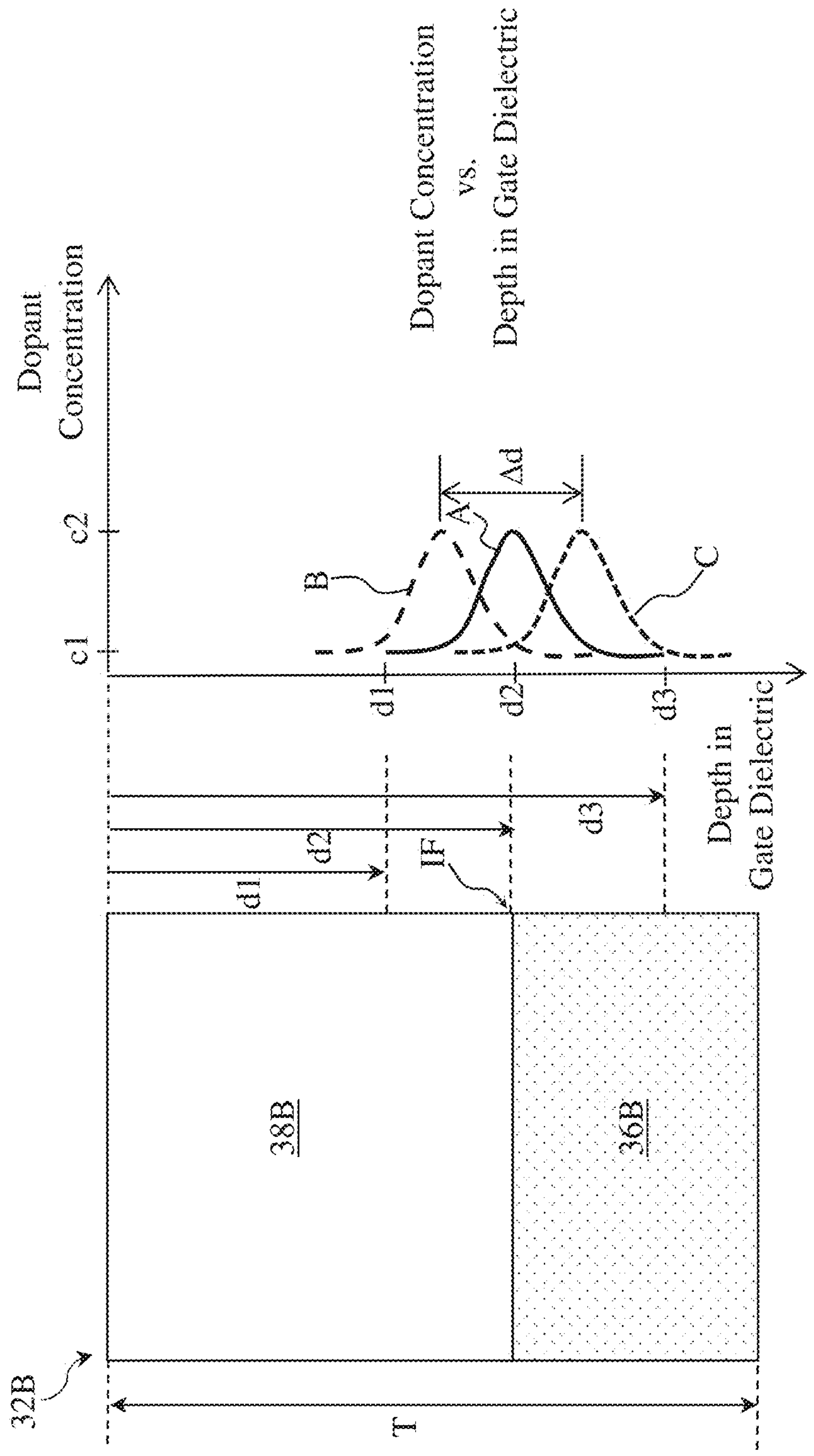
FIG. 12 illustrates an exemplary dipole dopant profile of a gate dielectric of a device of a stacked device structure, such as the device after dipole engineering associated with FIGS. 7A-9A and FIGS. 7B-9B, according to various aspects of the present disclosure.

Referring to FIG. 11A and FIG. 11B, a planarization process is performed to remove excess gate materials, such as those disposed over dielectric layer 250. For example, a chemical mechanical polishing (CMP) process is performed that removes portions of bulk layer 284, barrier layer 282, work function layer 280, and gate dielectric layer 38B disposed over dielectric layer 250. The CMP process is performed until a top surface of dielectric layer 250 is reached (exposed). In some embodiments, the CMP process is continued and reduces a thickness of dielectric layer 250, and correspondingly, a height of gate structure 30B. In the depicted embodiment, a top of gate structure 30B is substantially planar with a top of dielectric layer 250 after the CMP process, and remainders of the gate materials, which fill gate opening 255, form the gate stack of gate structure 30B. As noted above, the gate stack includes gate dielectric 32B (e.g., interfacial layer 36B and gate dielectric layer 38B) and gate electrode 34B (e.g., bulk layer 284, barrier layer 282, and work function layer 280). Since gate dielectric layer 38B is a high-k dielectric layer, the gate stack can be referred to as a high-k/metal gate. In some embodiments, processing can further include etching back gate electrode 34B and/or gate dielectric 32B (i.e., gate dielectric layer 38B thereof) and forming a hard mask, such as hard mask 42B, of the gate stack over the etched-back gate electrode 34B and/or gate dielectric 32B.

As described herein, transistor 18B is fabricated as a GAA transistor (i.e., a transistor having a gate that surrounds at least one suspended channel (for example, nanowires, nanosheets, nanobars, etc.), where the at least one suspended channel extends between source/drains). The GAA transistor may be a p-type GAA transistor or an n-type GAA transistor. In the depicted embodiment, transistor 18B is an n-type GAA transistor that includes a channel (e.g., channel layers 20B), source/drains (e.g., epitaxial source/drains 25B), and a gate (e.g., a gate stack that includes gate dielectric 32B and gate electrode 34B). The gate engages the channel extending between the source/drains, and current can flow between the source/drains (e.g., between source and drain or vice versa) during operation. In the depicted embodiment, the gate is on a top and a bottom of the channel in the X-Z plane, and the gate surrounds the channel in the Y-Z plane (e.g., the gate stack is disposed on a top, a bottom, and sidewalls of channel layers 20B).

In some embodiments, transistor 18B is fabricated as a FinFET. In such embodiments, the gate stack partially surrounds and/or wraps the channel. For example, the channel is a portion of a semiconductor fin extending from substrate 202, the gate stack is on a top of the semiconductor fin in the X-Z plane, and the gate stack wraps the semiconductor fin in the Y-Z plane (i.e., the gate stack is disposed on a top and sidewalls of the semiconductor fin). In such embodiments, gate dielectric 32B, dipole dopant source layer 265, and gate electrode 34B are formed over a top and sidewalls of a semiconductor fin.

In some embodiments, transistor 18B is fabricated as a planar transistor. In such embodiments, the gate stack is disposed on one side of the channel (e.g., a top surface). For example, the channel is a portion of a semiconductor substrate, and the gate stack is disposed on a top surface of semiconductor substrate in the X-Z plane and the Y-Z plane. In such embodiments, gate dielectric 32B, dipole dopant source layer 265, and gate electrode 34B are formed over a top of a channel region of a semiconductor substrate.

In some embodiments, fabrication of transistor 18B can further include forming various contacts that can facilitate operation thereof. For example, one or more dielectric layers, similar to dielectric layer 250, can be formed over gate structure 30B and dielectric layer 250. Contacts can then be formed in dielectric layer 250 and/or dielectric layers disposed over dielectric layer 250. For example, contacts are formed that are physically and/or electrically coupled, respectively, to the gate stack of gate structure 30B (e.g., gate electrode 34B thereof) and at least one epitaxial source/drain 25B of transistor 18B. For example, source/ drain contacts 50B are formed in dielectric layer 250, and source/drain contacts 50B are disposed on epitaxial source/drains 25B. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or a combination thereof. The metal silicide may include nickel silicide, cobalt silicide, tungsten silicide, tantalum silicide, titanium silicide, platinum silicide, erbium silicide, palladium silicide, or a combination thereof. In some embodiments, dielectric layers disposed over dielectric layer 250 and the contacts (for example, a gate contact and/or source/drain contacts extending through dielectric layer 250 and/or dielectric layers disposed thereover) are a portion of the MLI feature disposed over substrate 202.

Figure 13:
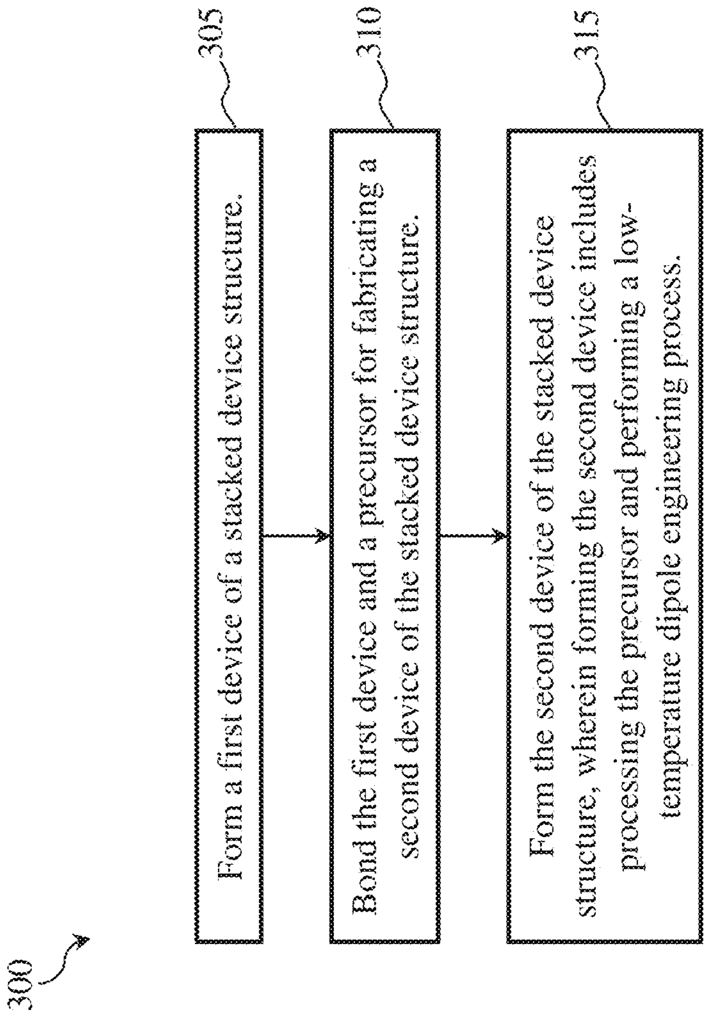
FIG. 13 is a flow chart of a method for fabricating a stacked device structure, such as the stacked device structure of FIG. 1, according to various aspects of the present disclosure.

FIG. 13 is a flow chart of a method 300 for fabricating a stacked device structure, such as stacked device structure 10 of FIG. 1, according to various aspects of the present disclosure. FIGS. 14A-14L are fragmentary cross-sectional views of stacked device structure 10, in portion or entirety, at various fabrication stages, such as those associated with method 300, according to various aspects of the present disclosure. In the depicted embodiment, a sequential fabrication scheme, such as a sequential CFET process, is implemented to form stacked device structure 10. FIG. 13 and FIGS. 14A-14L are discussed concurrently herein for ease of description and understanding. FIG. 13 and FIGS. 14A-14L have been simplified for the sake of clarity to better understand the inventive concepts of the present disclosure. Additional steps can be provided before, during, and after method 300, and some of the steps described can be moved, replaced, or eliminated for additional embodiments of method 300. Additional features can be added in stacked device structure 10, and some of the features described below can be replaced, modified, or eliminated in other embodiments of stacked device structure 10.

Figure 14A:
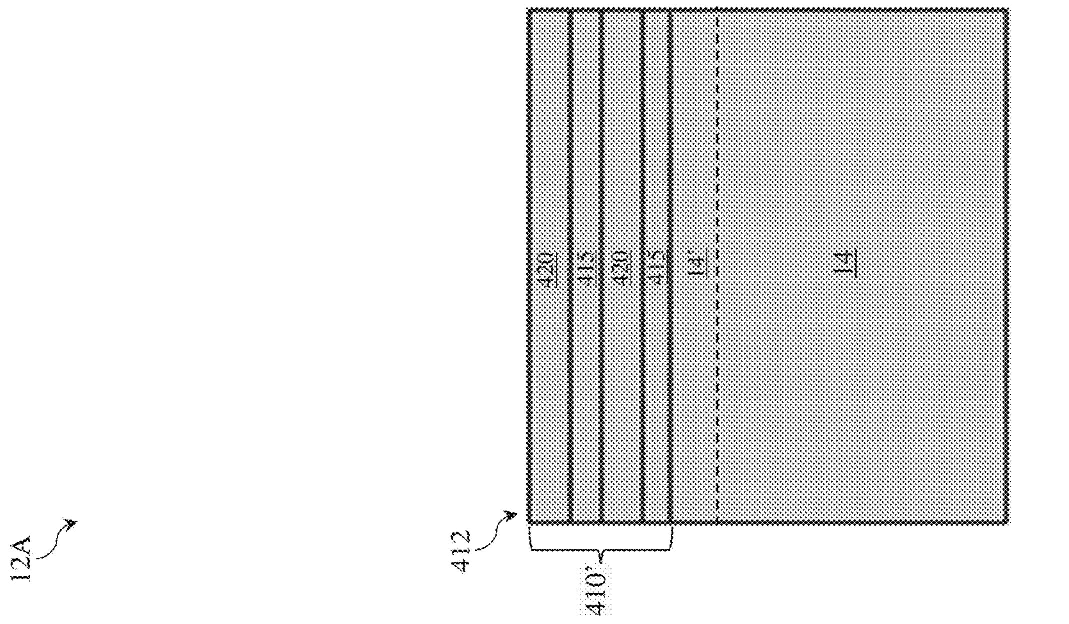
FIGS. 14A-14L are fragmentary cross-sectional views of a stacked device structure, in portion or entirety, at various fabrication stages, such as those associated with the method of FIG. 13, according to various aspects of the present disclosure.

Referring to FIG. 13 and FIGS. 14A-14E, method 300 at block 305 includes forming a first device of a stacked device structure, such as device 12A of stacked device structure 10. In FIG. 14A, fabricating device 12A includes depositing a semiconductor layer stack 410' (including semiconductor layers 415 and semiconductor layers 420) over substrate 14 and patterning semiconductor layer stack 410' and, optionally, substrate 14 to form a semiconductor fin 412 extending from substrate 14. Semiconductor fin 412 can include a patterned portion of semiconductor layer stack 410' (i.e., semiconductor layers 415 and semiconductor layers 420) and a patterned portion of substrate 14 (i.e., mesa 14'). Substrate 14, semiconductor layers 415, and semiconductor layers 420 may be similar to substrate 202, semiconductor layers 215, and semiconductor layers 220, respectively. For example, substrate 14 can be a silicon substrate, semiconductor layers 415 can be silicon germanium layers, and semiconductor layers 420 can be silicon layers. In some embodiments, semiconductor layers 415 and semiconductor layers 420 are alternatingly epitaxially grown over substrate 14. In some embodiments, semiconductor layer stack 410' is patterned using a lithography process and an etching process. In some embodiments, semiconductor fin 412 is formed by a fin fabrication process. In some embodiments, isolation features are formed over substrate 14 and adjacent to semiconductor fin 412. The isolation features may be similar to isolation features 222. In some embodiments, the isolation features can be formed by depositing an insulator material (e.g., by CVD) over substrate 14 and etching back the insulator material, such that at least semiconductor layer stack 410' of semiconductor fin 412 extends from the isolation feature.

Figure 14B:
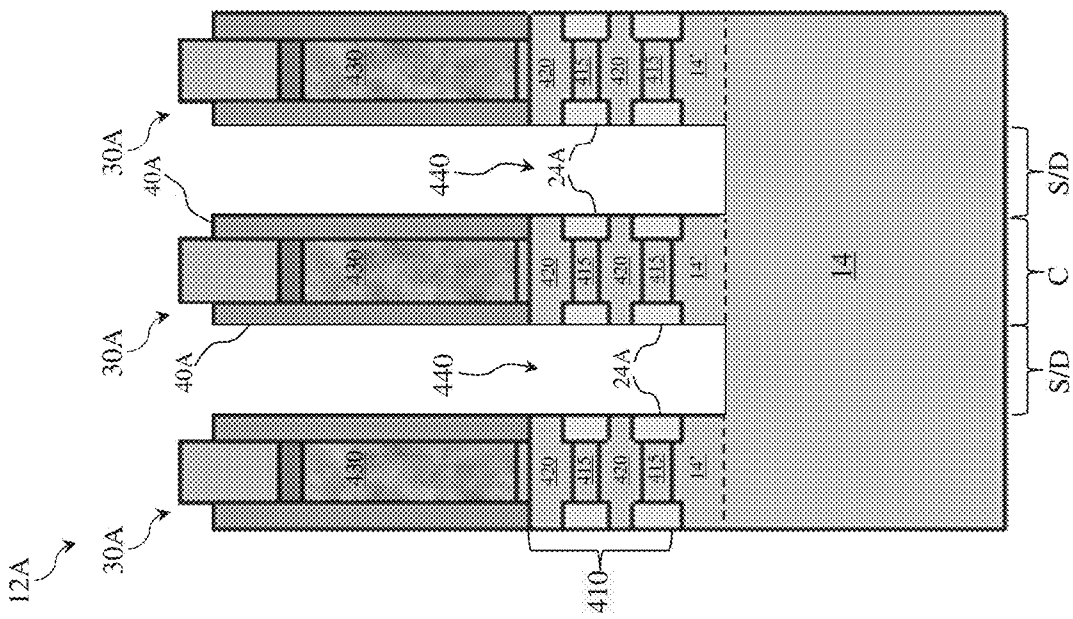

In FIG. 14B, fabricating device 12A can include forming gate structures 30A over channel regions of semiconductor fin 412, forming source/drain recesses 440 in source/drain regions of semiconductor fin 412, and forming inner spacers 24A. In some embodiments, forming gate structures 30A includes forming at least one dummy gate layer (e.g., a dummy oxide layer, a poly gate layer, and a hard mask layer) over semiconductor fin 412 and substrate 14, patterning the at least one dummy gate layer to form dummy gates 430, and forming gate spacers 40A along sidewalls of dummy gates 430. Dummy gates 430 and gate spacers 40A may be similar to dummy gates 230 and gate spacers 40B, respectively. In some embodiments, forming source/drain recesses 440 can include performing an etching process that selectively removes semiconductor layers 415 and semiconductor layers 420 relative to gate structures 30A, such that remainders of semiconductor fin 412 form channel layers 410 in the channel regions. In some embodiments, forming inner spacers 24A includes laterally etching semiconductor layers 415 to form gaps between semiconductor layers 420 and between semiconductor layers 420 and mesas 14' and filling the gaps with a dielectric material (e.g., deposit and etch a dielectric layer(s)). Inner spacers 24A may be similar to inner spacers 24B.

Figure 14D:
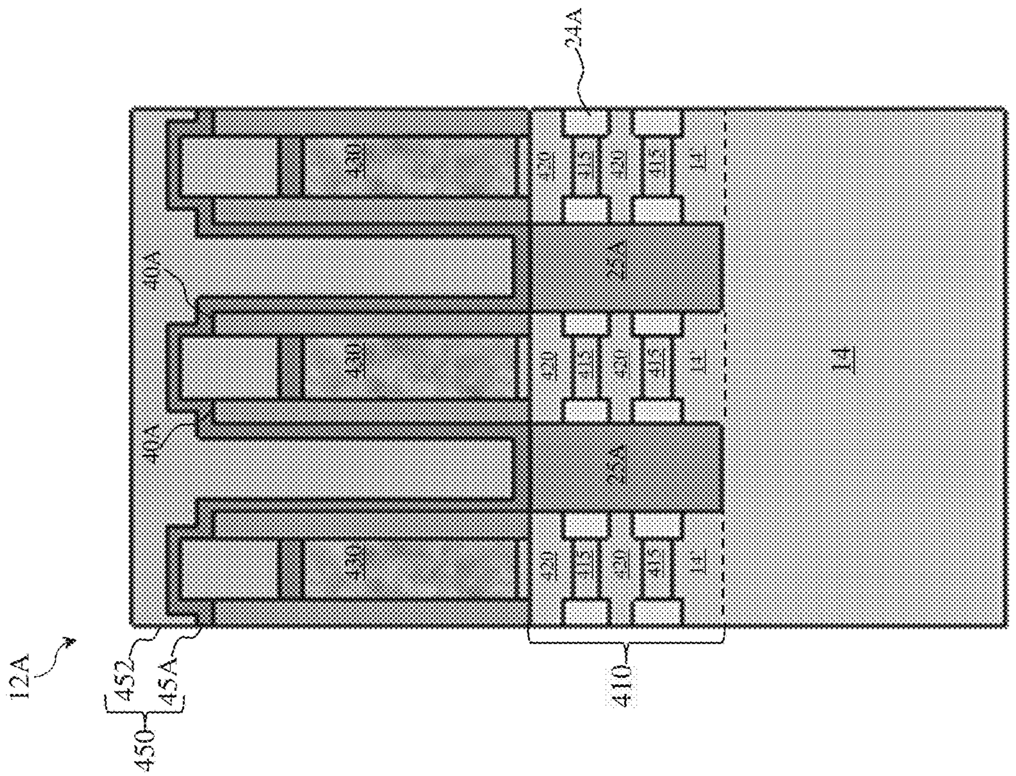
Figure 14C:
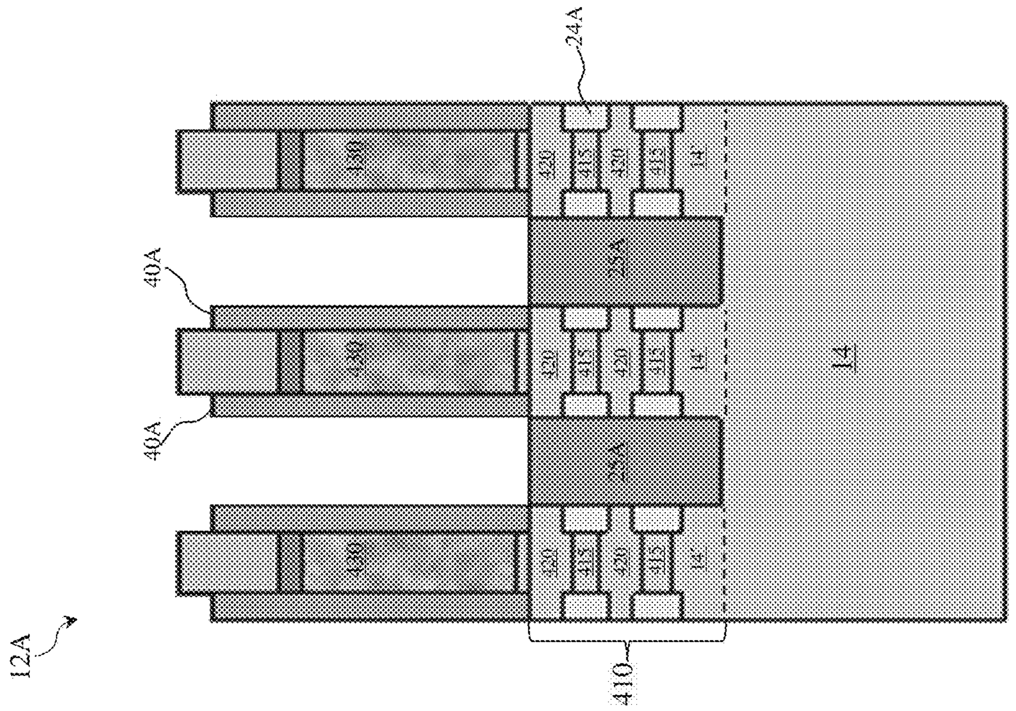

In FIG. 14C and FIG. 14D, fabrication of device 12A can further include forming epitaxial source/drains 25A in source/drain recesses 440 (FIG. 14C) and forming a dielectric layer 450 (including CESL 45A and an ILD layer 452) over epitaxial source/drains 25A and gate structures 30A (FIG. 14D). Epitaxial source/drains 25A may be similar to epitaxial source/drains 25B. For example, epitaxial source/drains 25A include an epitaxial material that is tuned and selected based on type of device and/or transistor being fabricated. In some embodiments, where transistor 18A is configured as a p-type transistor and transistor 18B is configured as an n-type transistor, epitaxial source/drains 25A include silicon germanium or germanium doped with boron and/or other p-type dopant, and epitaxial source/drains 25B can include silicon doped with carbon, phosphorous, arsenic, other n-type dopant, or a combination thereof. Dielectric layer 450, ILD layer 452, and CESL 45A may be similar to dielectric layer 250, ILD layer 252, and CESL 45B, respectively. In some embodiments, forming dielectric layer 450 includes depositing CESL 45A over epitaxial source/drains 25A and gate structures 30A and depositing ILD layer 452 over CESL 45A. A planarization process, such as CMP, can be applied to remove dielectric layer 450 from over gate structures 30A.

Figure 14E:
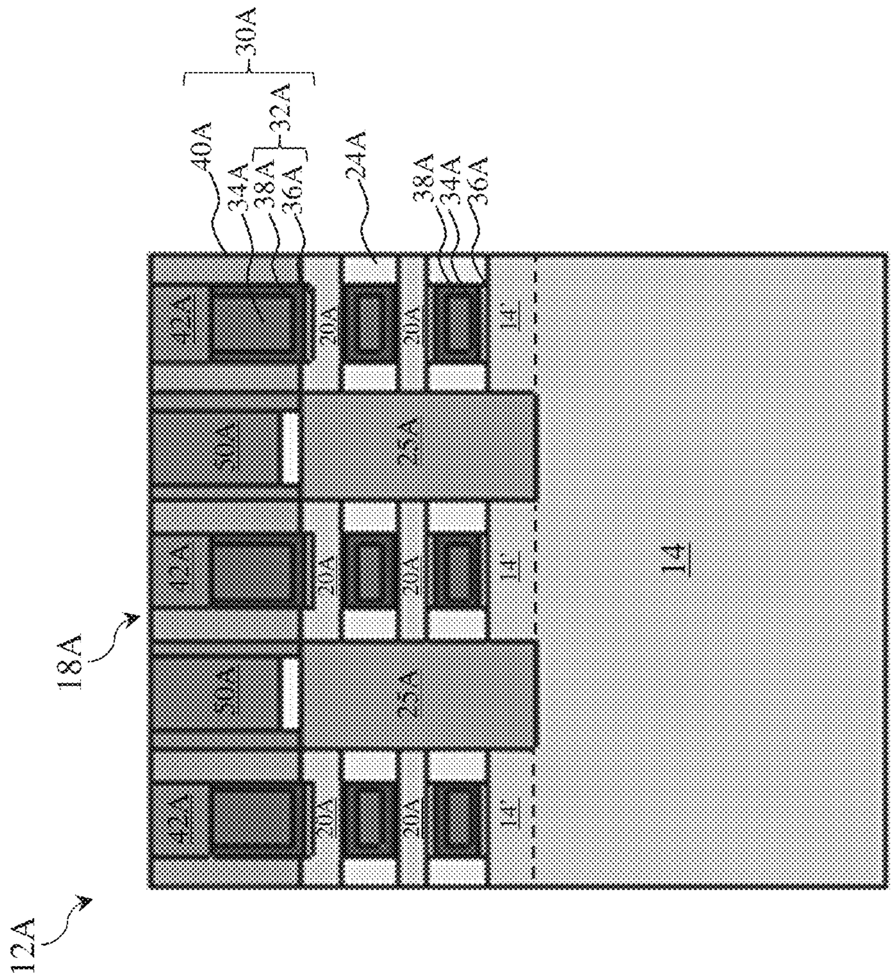

In FIG. 14E, fabrication of device 12A can further include performing a gate replacement process (i.e., replacing dummy gates 430 with gate stacks including gate dielectrics 32A and gate electrodes 34A) and performing a channel release process to provide channel layers 20A. In some embodiments, the gate replacement process includes removing dummy gates 430 to form gate openings in gate structures 30A, depositing gate dielectric layers that partially fill the gate openings, depositing gate electrode layers that fill remainders of the gate openings, and performing a planarization process to remove portions of the gate dielectric layers and/or portions of the gate electrode layers over dielectric layer 450. In some embodiments, dipole engineering is performed on the gate dielectric layers. In some embodiments, the channel release process is performed before depositing the gate dielectric layers. The channel release process can include selectively removing semiconductor layers 415, thereby suspending semiconductor layers 420 over substrate 14 to provide channel layers 20A and forming gaps in the gate openings between channel layers 20A and between channel layers 20A and mesas 14'. The gate dielectric layers and/or the gate electrode layers can fill the gaps, such that the gate dielectric layers and/or the gate electrode layers can form around channel layers 20A. The gate replacement process and/or the channel release process may be similar to the gate replacement process and/or the channel release process described above. For example, processing described with reference to FIG. 2 (e.g., at blocks 110-145 of method 100), FIGS. 4A-11A, and FIGS. 4B-11B may be implemented to form the gate stacks of gate structures 30B (i.e., gate dielectrics 32A and gate electrodes 34B) and channel layers 20A as depicted in FIG. 14E.

Gate dielectrics 32A and gate electrodes 34A may be similar to gate dielectrics 32B and gate electrodes 34B, respectively. For example, gate dielectrics 32A include at least one gate dielectric layer (e.g., interfacial layers 36A and gate dielectric layers 38A), and gate electrodes 34A include at least one electrically conductive layer. In some embodiments, interfacial layers 36A are group-IV-based oxide layers or group III-V-based oxide layers, such as silicon oxide layers. In some embodiments, gate dielectric layers 38A are high-k dielectric layers, such as hafnium-based oxide ($HfO_2$) layers or zirconium-based oxide ($ZrO_2$) layers. Similar to gate dielectrics 32B, dipole engineering is performed on gate dielectrics 32A during the gate replacement process, such that gate dielectrics 32A also include n-dipole dopant, p-dipole dopant, or a combination thereof. In some embodiments, gate electrodes 34A each include a work function layer, a barrier layer, and a bulk layer, or a combination thereof, which may be similar to work function layer 280, barrier layer 282, and bulk layer 284, respectively. In some embodiments, gate structures 30A further include hard masks 42A, such as self-aligned cap (SAC) layers. Hard masks 42A can include a dielectric material, such as silicon nitride.

Fabrication of device 12A can further include forming interconnects, such as gate contacts and/or source/drain contacts 50A, of device 12A. In some embodiments, forming source/drain contacts 50A includes forming source/drain contact openings in dielectric layer 450 that expose epitaxial source/drains 25A and forming at least one electrically conductive layer (e.g., metal) in the source/drain contact openings. In some embodiments, the source/drain contact openings are formed by forming a patterned mask layer (e.g., an etch mask) over dielectric layer 450 and etching exposed portions of dielectric layer 450. In some embodiments, forming at least one electrically conductive layer in the source/drain contact openings includes forming metal silicide layers over epitaxial source/drains 25A, depositing a barrier/liner layer that partially fills the source/drain contact openings, depositing a metal layer over the barrier/liner layer that fills remainders of the source/drain contact openings, and performing a planarization process to remove portions of the barrier/liner layer and/or the metal layer that are disposed over the tops of dielectric layer 450 and/or gate structures 30A. A source/drain contact may thus include a metal silicide layer, a barrier/liner layer, and a bulk metal layer, where the barrier/liner layer is between the bulk metal layer and dielectric layer 450 (e.g., CESL 45A) and the bulk metal layer and the metal silicide layer. In some embodiments, one or more insulation layers may be formed in the source/drain contact openings and processed to form contact spacers, such as dielectric layers and/or air gaps, along sidewalls of electrically conductive portions of source/drain contacts 50A (e.g., barrier layer and/or bulk metal layer).

Figure 14F:
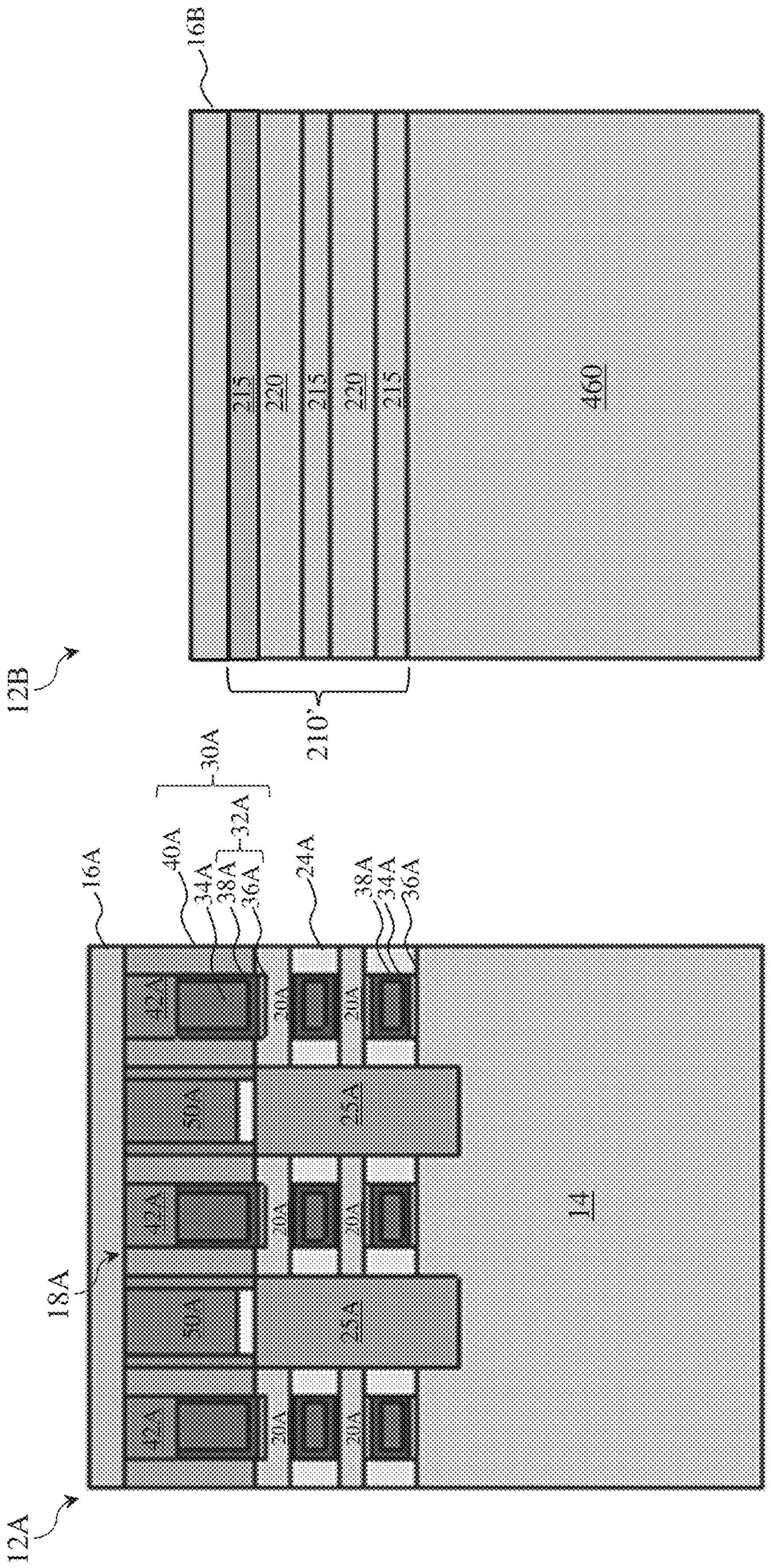
Figure 14H:
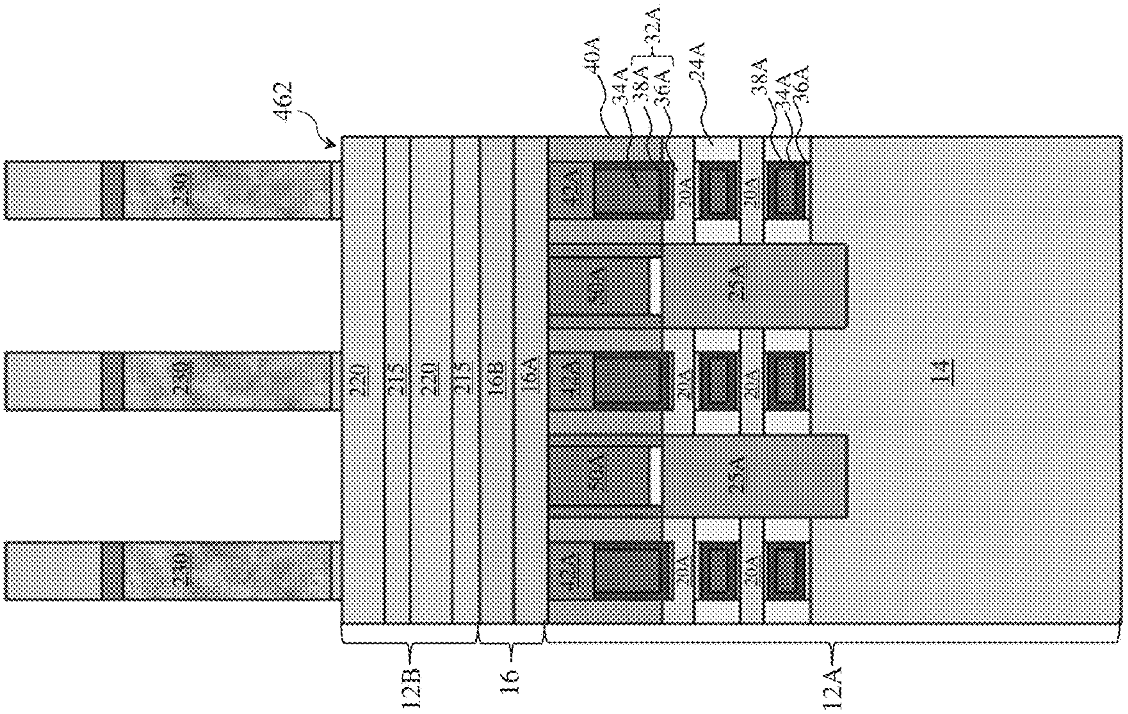
Figure 14G:
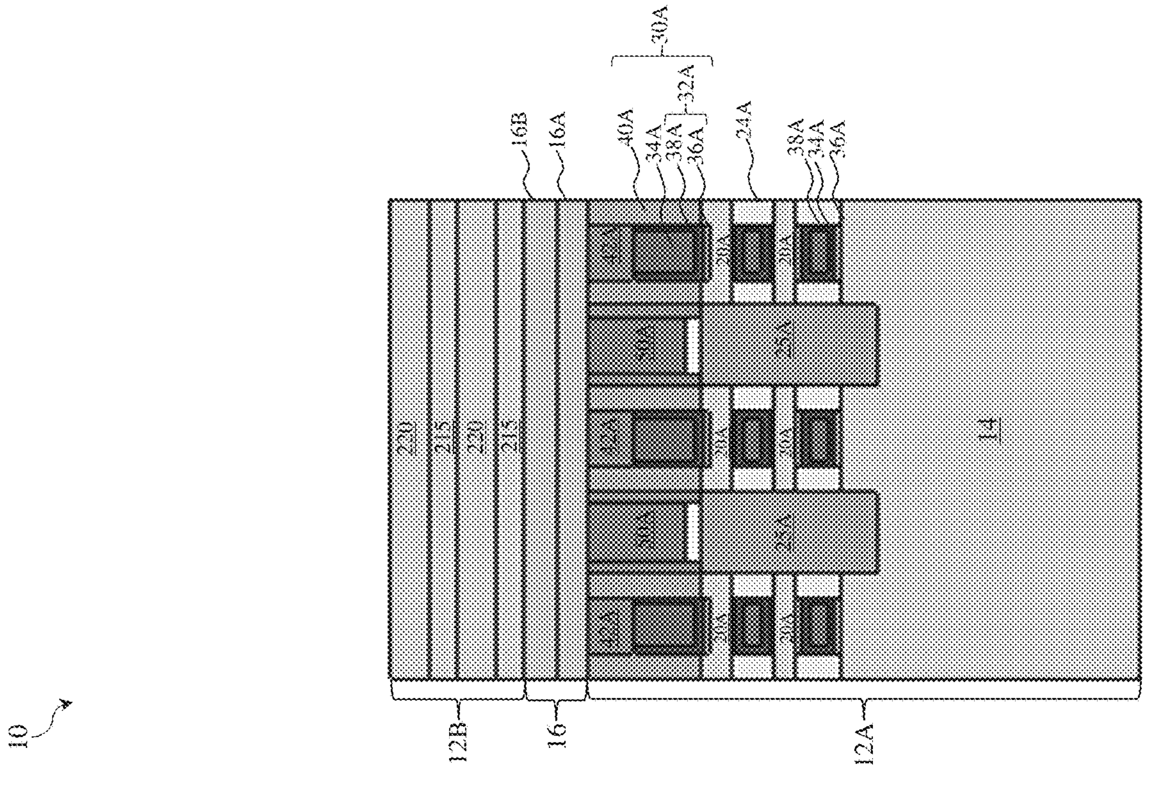

Referring to FIG. 13, FIG. 14F, and FIG. 14G, method 300 at block 310 includes attaching and/or bonding the first device of the stacked device structure, such as device 12A of stacked device structure 10, and a precursor for fabricating a second device of the stacked device structure, such as a precursor for fabricating device 12B of stacked device structure 10. In the depicted embodiment, the precursor for fabricating device 12B includes a semiconductor layer stack 210' disposed over a substrate 460. Semiconductor layer stack 210' includes semiconductor layers 215 and semiconductor layers 220. Bottom semiconductor layer 215 can form a frontside of device 12B, and top semiconductor layer 215 can form a backside of device 12B. In some embodiments, semiconductor layers 215 and semiconductor layers 220 are alternatingly epitaxially grown over substrate 460. In some embodiments, substrate 460 is a semiconductor substrate, such as a silicon substrate. In some embodiments, substrate 460 is a carrier substrate that includes silicon, soda-lime glass, fused silica, fused quartz, calcium fluoride, other suitable carrier substrate material, or a combination thereof.

In FIG. 14F and FIG. 14G, a frontside of device 12A is bonded and/or attached to a backside of device 12B by insulation layer 16 (also referred to as a bonding layer). In some embodiments, device 12A is bonded to the precursor using dielectric-to-dielectric bonding. For example, bonding includes forming insulation layer 16A (i.e., a first dielectric layer) over frontside of device 12A (FIG. 14F), forming insulation layer 16B (i.e., a second dielectric layer) over a backside of device 12B (FIG. 14F), flipping over and placing the precursor over device 12A, such that insulation layer 16B contacts insulation layer 16A (FIG. 14G), and performing an annealing process or other suitable process to effectuate bonding of insulation layer 16A and insulation layer 16B. In some embodiments, insulation layer 16 is an oxide layer that attaches device 12A to the precursor for fabricating device 12B. In some embodiments, the dielectric-to-dielectric bonding process is an oxide-to-oxide bonding process that includes bonding an oxide layer formed on device 12A with an oxide layer formed on the precursor of device 12B. In some embodiments, a thickness of insulation (bonding) layer 16 is about 10 nm to about 100 m.

After bonding, a thinning process and/or a de-bonding process may be performed to remove substrate 460 from the frontside of device 12B. For example, a planarization process, such as CMP, or an etching process can be performed to remove substrate 460. Top semiconductor layer 215 may function as a CMP stop layer and/or an etch stop layer when removing substrate 460. Thereafter, top semiconductor layer 215 may be removed from semiconductor layer stack 210', for example, by an etching process. Removing top semiconductor layer 215 provides device 12B with a top semiconductor layer 220, which will provide a top channel of device 12B as described herein. Other methods and/or techniques for removing substrate 460 and/or top semiconductor layer 215 are contemplated.

Referring to FIG. 13 and FIGS. 14H-14L, method 300 at block 315 includes forming a second device of a stacked device structure, such as device 12B of stacked device structure 10. Forming device 12B includes processing the precursor (e.g., semiconductor layer stack 210') and performing a low-temperature dipole engineering process, as described herein. In FIG. 14H, fabricating device 12B includes patterning semiconductor layer stack 210' to form a semiconductor fin 462 extending from insulation layer 16.

Semiconductor fin 462 can include a patterned portion of semiconductor layer stack 210' (i.e., semiconductor layers 215 and semiconductor layers 220). In some embodiments, insulation layer 16 is also patterned, such that semiconductor fin 462 is disposed on a patterned portion of insulation layer 16 (i.e., an insulation mesa). In some embodiments, semiconductor layer stack 210' is patterned using a lithography process and an etching process. In some embodiments, semiconductor fin 462 is formed by a fin fabrication process. In some embodiments, isolation features, such as isolation features 222, are formed over insulation layer 16 and adjacent to semiconductor fin 462.

Figure 14I:
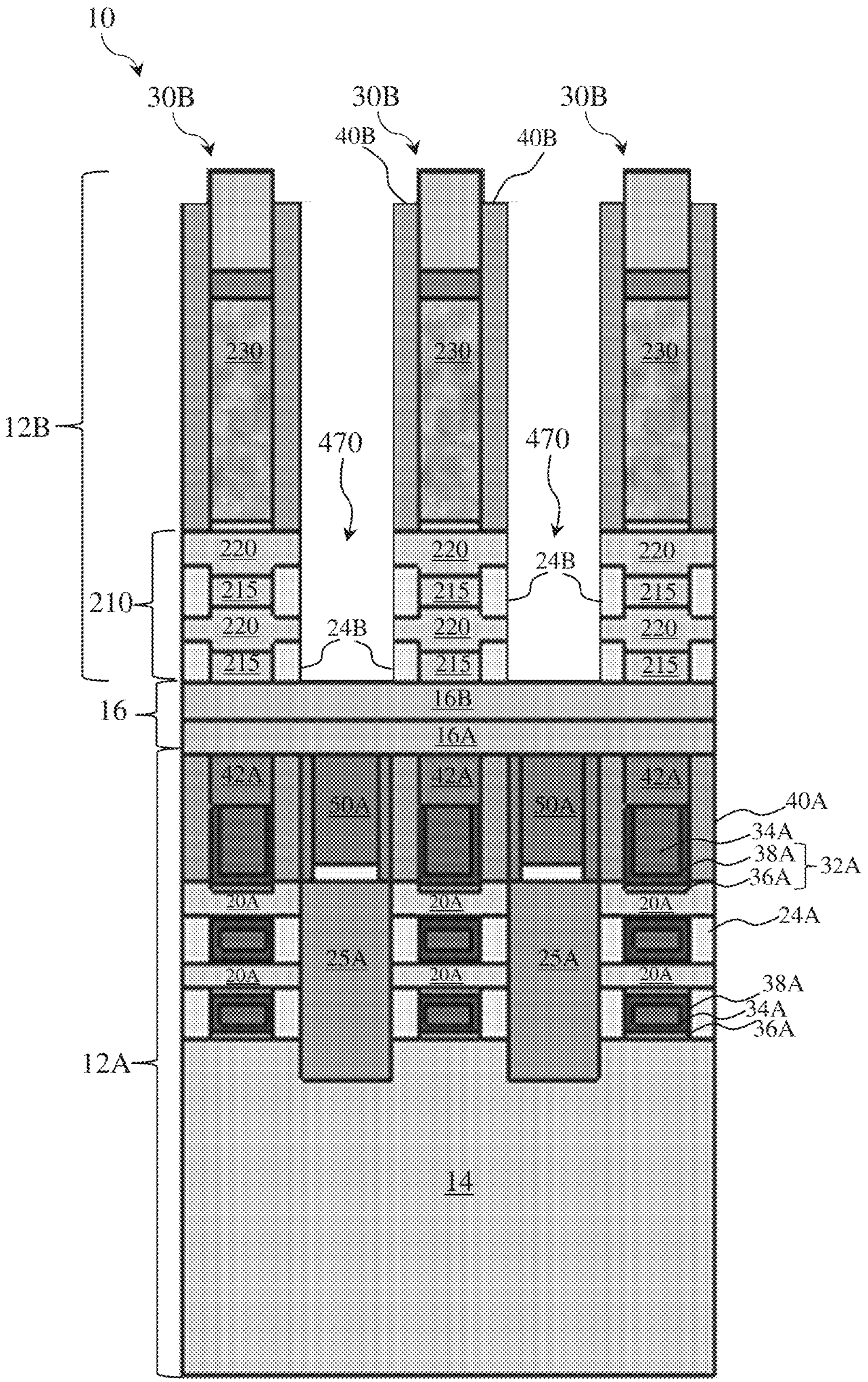

In FIG. 14H and FIG. 14I, fabricating device 12B can further include forming gate structures 30B over channel regions of semiconductor fin 462, forming source/drain recesses 470 in source/drain regions of semiconductor fin 462, and forming inner spacers 24B. In some embodiments, forming gate structures 30B includes forming at least one dummy gate layer (e.g., a dummy oxide layer, a poly gate layer, and a hard mask layer) over semiconductor fin 462 and insulation layer 16, patterning the at least one dummy gate layer to form dummy gates 230, and forming gate spacers 40B along sidewalls of dummy gates 230. In some embodiments, forming source/drain recesses 470 can include performing an etching process that selectively removes semiconductor layers 215 and semiconductor layers 220 relative to gate structures 30B, such that remainders of semiconductor fin 462 form channel layers 210 in the channel regions. In some embodiments, forming inner spacers 24B includes laterally etching semiconductor layers 215 to form gaps between semiconductor layers 220 and between semiconductor layers 220 and insulation layer 16 (e.g., insulation mesas thereof) and filling the gaps with a dielectric material (e.g., deposit and etch a dielectric layer(s)). In some embodiments, processing described with reference to FIG. 2 (e.g., at block 105 of method 100), FIG. 3A, and FIG. 3B may be implemented to form gate structures 30B (including dummy gates 230 and gate spacers 40B), channel layers 210, and inner spacers 24B as depicted in FIG. 14H and FIG. 14I.

Figure 14J:
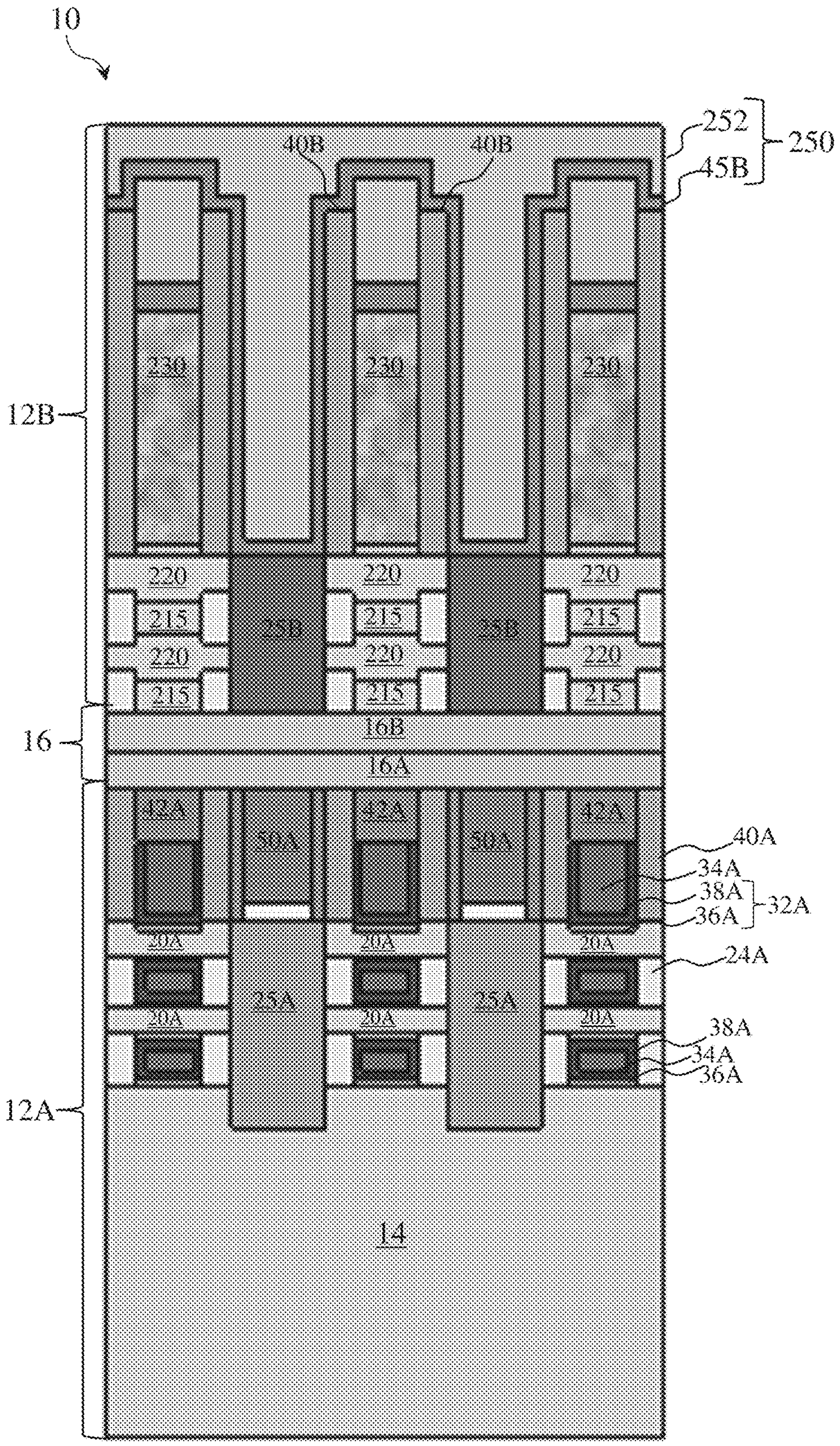

In FIG. 14J, fabrication of device 12B can further include forming epitaxial source/drains 25B in source/drain recesses 470 and forming dielectric layer 250 (including CESL 45B and ILD layer 252) over epitaxial source/drains 25B and gate structures 30B. As noted above, epitaxial source/drains 25B include an epitaxial material that is tuned and selected based on type of device and/or transistor being fabricated. Here, where transistor 18B is configured as an n-type transistor, epitaxial source/drains 25B can include silicon doped with carbon, phosphorous, arsenic, other n-type dopant, or a combination thereof. In some embodiments, dielectric layer 250 is formed as described above with reference to FIG. 2 (e.g., at block 105 of method 100), FIG. 3A, and FIG. 3B. A planarization process, such as CMP, can be applied to remove dielectric layer 250 from over gate structures 30B (FIG. 14K).

Figure 14L:
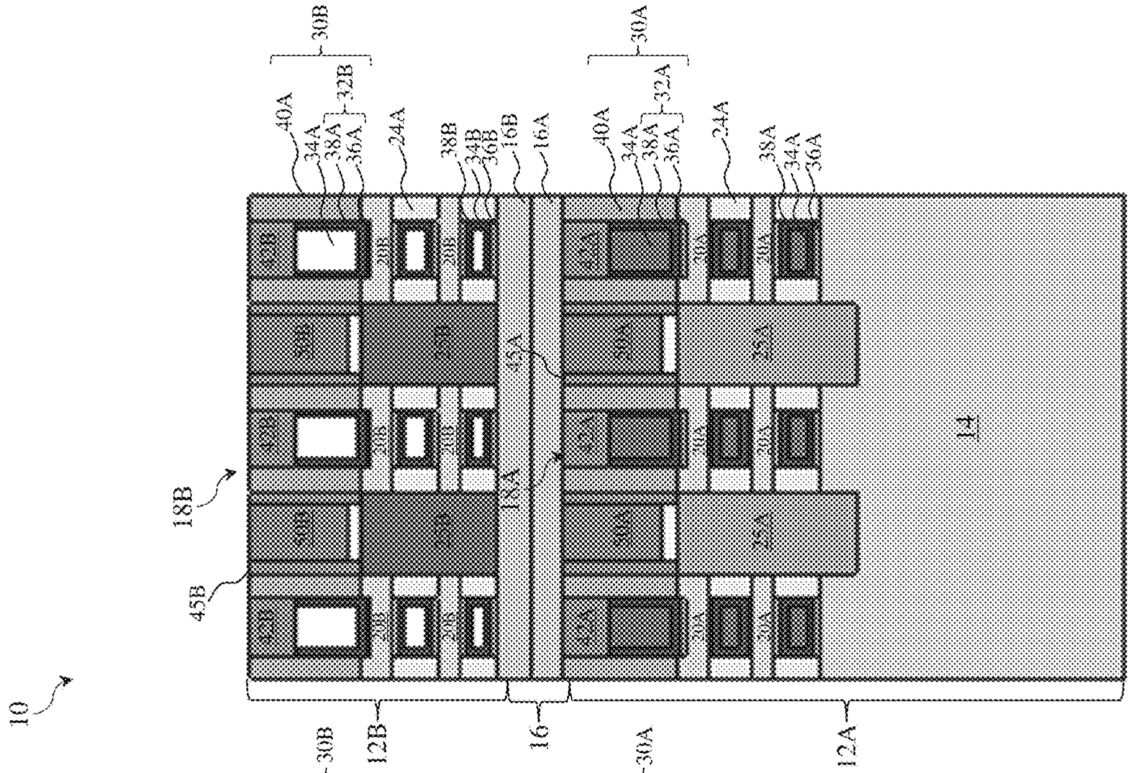
Figure 14K:
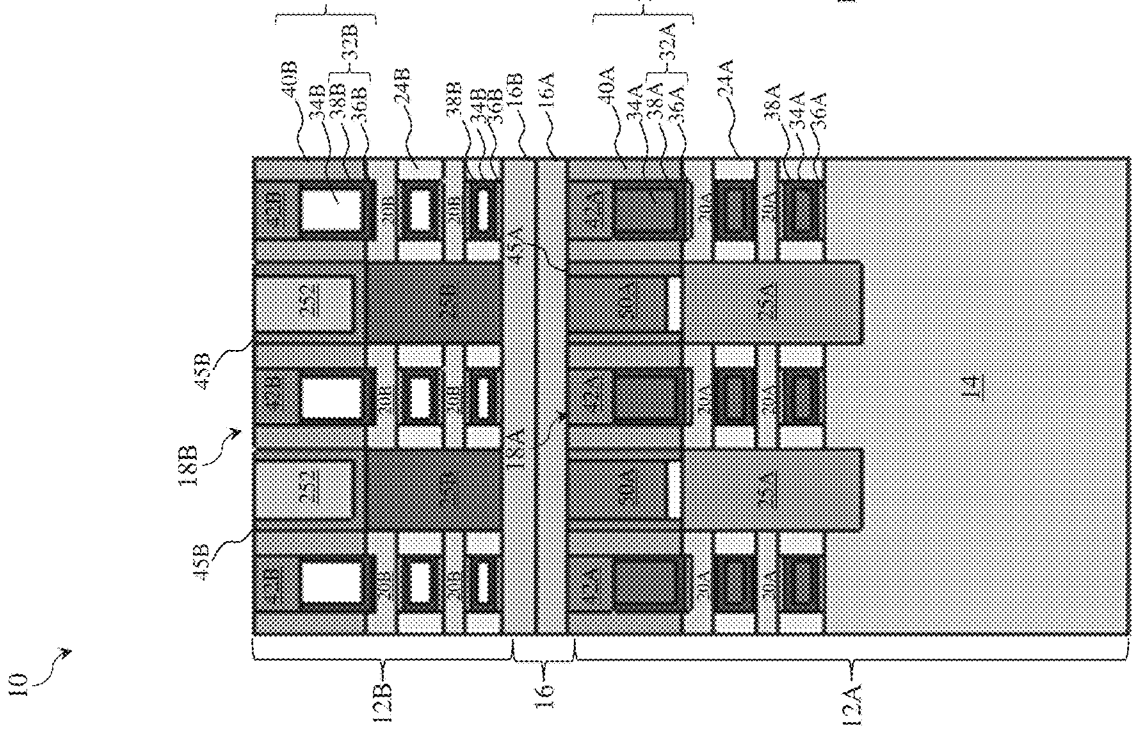

In FIG. 14K and FIG. 14L, fabrication of device 12B can further include performing a gate replacement process (i.e., replacing dummy gates 230 with gate stacks including gate dielectrics 32B and gate electrodes 34B) (FIG. 14K), performing a channel release process to provide channel layers 20B (FIG. 14K), and forming interconnects, such as gate contacts and/or source/drain contacts 50B, of device 12B (e.g., FIG. 14L). Since device 12B is fabricated on device 12A, processes implemented to form transistor 18B, such as the gate stack thereof, can negatively impact characteristics and/or reliability of device 12A, such as described above. For example, high temperature processes can undesirably alter doping profiles of transistor 18A, which can undesirably alter its threshold voltage, and/or degrade structural integrity of transistor 18A, which can undesirably degrade its reliability. To minimize and/or eliminate such negative impacts, the gate stack and channel layers 20B of transistor 18B (top transistor) are formed as described above with reference to FIG. 2 (e.g., at blocks 110-145 of method 100), FIGS. 4A-11A, and FIGS. 4B-11B. For example, fabrication can include removing dummy gates 230 to form gate openings in gate structures 30B (FIG. 4A and FIG. 4B), performing a channel release process (FIG. 5A and FIG. 5B), depositing a gate dielectric layer (e.g., interfacial layer 36B' and gate dielectric layer 38B') that partially fills the gate openings (FIG. 6A and FIG. 6B), performing a low-temperature dipole engineering process on the gate dielectric layer (FIGS. 7A-9A and FIGS. 7B-9B), depositing gate electrode layers (e.g., work function layer 280, barrier layer 282, and/or bulk layer 284) that fill remainders of the gate openings (FIG. 10A and FIG. 10B), and performing a planarization process to remove portions of the gate dielectric layers and/or portions of the gate electrode layers over dielectric layer 250 (FIG. 11A and FIG. 11B). The channel release process can include selectively removing semiconductor layers 215, thereby suspending semiconductor layers 220 over insulator layer 16 to provide channel layers 20B and forming gaps in the gate openings between channel layers 20B and between channel layers 20B and insulator layer 16 (or mesas thereof). The gate dielectric layers and/or the gate electrode layers can fill the gaps and thus form around channel layers 20B. Source/drain contacts 50B can then be formed similar to that described for source/drain contacts 50A.

The gate stacks of transistor 18A may be configured the same or different than the gate stacks of transistor 18B. In the depicted embodiment, since transistor 18A is configured as a p-type transistor and transistor 18B is configured as an n-type transistor, gate dielectric 32A and gate dielectric 32B include different dipole dopant conductivity types. For example, gate dielectric 32A includes p-dipole dopant, and gate dielectric 32B includes n-dipole dopant that is driven therein at sub-600° C. temperatures (e.g., strontium, erbium, magnesium, or a combination thereof). In some embodiments, the p-dipole dopant (e.g., aluminum) is driven in at temperatures greater than 600° C. In some embodiments, the p-dipole dopant (e.g., titanium) is driven in at sub-600° C. temperatures. Further, in such example, gate electrode 34A and gate electrode 34B may include different work function materials. For example, gate electrode 34A can include a p-type work function material, and gate electrode 34B can include an n-type work function material. In some embodiments, gate dielectric 32A and gate dielectric 32B include different dipole dopant conductivity types, and gate electrode 34A and gate electrode 34B include the same electrically conductive materials (e.g., same work function materials).

In some embodiments, where transistor 18A and transistor 18B are both configured as n-type transistors, gate dielectric 32A and gate dielectric 32B include the same dipole dopant conductivity types (i.e., n-dipole dopant). Since transistor 18A is a bottom transistor of stacked device structure 10 and is thus fabricated first, fabrication of transistor 18A may not impact already fabricated devices and process temperatures, such as thermal drive-in temperatures, can be relaxed. For example, in some embodiments, gate dielectric 32A includes n-dipole dopant that can be driven therein at temperatures greater than about 600° C. (e.g., lanthanum), while gate dielectric 32B includes n-dipole dopant that is driven therein at sub-600° C. temperatures (e.g., strontium, erbium, magnesium, or a combination thereof). In some embodiments, gate dielectric 32A and gate dielectric 32B include the same n-dipole dopant, which is driven therein at sub-600° C. temperatures (e.g., strontium, erbium, magnesium, or a combination thereof).

In some embodiments, where transistor 18A is configured as an n-type transistor and transistor 18B is configured as a p-type transistor, gate dielectric 32A and gate dielectric 32B include different dipole dopant conductivity types. Since transistor 18A is a bottom transistor of stacked device structure 10 and is thus fabricated first, fabrication of transistor 18A may not impact already fabricated devices and process temperatures, such as thermal drive-in temperatures, can be relaxed. For example, in some embodiments, gate dielectric 32A includes n-dipole dopant that can be driven therein at temperatures greater than about 600° C. (e.g., lanthanum), while gate dielectric 32B includes p-dipole dopant. In some embodiments, the p-dipole dopant can be driven into gate dielectric 32B at sub-600° C. temperatures. In some embodiments, gate dielectric 32A include n-dipole dopant that is driven therein at sub-600° C. temperatures (e.g., strontium, erbium, magnesium, or a combination thereof).

Devices and/or structures described herein, such as stacked device structure 10, device 12A, device 12B, transistor 18A, and transistor 18B, etc. may be included in a microprocessor, a memory, other IC device, or a combination thereof. In some embodiments, stacked device structures described herein are a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other components, or a combination thereof.

The present disclosure provides for many different embodiments. Gate stack (e.g., high-k/metal gate) fabrication methods that implement low-temperature dipole engineering are described herein and provide numerous advantages, particularly for stacked device structures. The gate stacks disclosed herein may be implemented in a variety of device types. For example, the gate stacks described herein are suitable for planar field-effect transistors (FETs), multigate transistors, such as FinFETs, GAA transistors, omega-gate (Ω-gate) devices, pi-gate (Π-gate) devices, or a combination thereof, as well as strained-semiconductor devices, silicon-on-insulator (SOI) devices, partially-depleted SOI devices, fully-depleted SOI devices, other devices, or a combination thereof. The present disclosure further contemplates that one of ordinary skill may recognize other semiconductor devices, such as capacitors, that can benefit from the material layer stacks and dipole engineering techniques described herein.

An exemplary method for forming a gate stack of a transistor of a transistor stack includes forming a high-k dielectric layer, forming an n-dipole dopant source layer over the high-k dielectric layer, performing a thermal drive-in process that drives an n-dipole dopant from the n-dipole dopant source layer into the high-k dielectric layer, and forming at least one electrically conductive gate layer over the high-k dielectric layer after removing the n-dipole dopant source layer. A drive-in temperature of the thermal drive-in process is less than 600° C. In some embodiments, the drive-in temperature of the thermal drive-in process is about 300° C. to about 500° C. In some embodiments, the method further includes forming an interfacial layer before forming the high-k dielectric layer, where the interfacial layer and the high-k dielectric layer form a gate dielectric of the gate stack. In some embodiments, the method further includes tuning parameters of the thermal drive-in process to provide the gate dielectric with a desired n-dipole dopant profile along a thickness of the gate dielectric. A peak of the desired n-dipole dopant profile is located at an interface between the high-k dielectric layer and the interfacial layer ±0.5 nm, and the peak of the desired n-dipole dopant profile corresponds with a location in the gate dielectric having a maximum n-dipole dopant concentration.

In some embodiments, the n-dipole dopant is a metal, the n-dipole dopant source layer includes the metal and oxygen, and the n-dipole dopant provides the n-dipole dopant source layer with metal-oxygen bonds having a bond dissociation energy that is less than a bond dissociation energy of lanthanum-oxygen bonds. In some embodiments, the n-dipole dopant is strontium. In some embodiments, the n-dipole dopant is erbium. In some embodiments, the n-dipole dopant is magnesium. In some embodiments, the n-dipole dopant is strontium, erbium, magnesium, other n-dipole dopant that can be driven into high-k dielectric layer using sub-600° C. drive-in temperatures, or a combination thereof.

Another exemplary method includes forming a first transistor of a transistor stack, bonding the first transistor of the transistor stack to a precursor for fabricating a second transistor of the transistor stack, and forming the second transistor over the first transistor. Forming the second transistor includes processing the precursor, forming a gate stack of the second transistor, and performing a dipole engineering process. The gate stack includes a gate dielectric and a gate electrode. The dipole engineering process includes forming an n-dipole dopant source layer over the gate dielectric, performing a thermal drive-in process that drives an n-dipole dopant from the n-dipole dopant source layer into the gate dielectric, and removing the n-dipole dopant source layer. A drive-in temperature of the thermal drive-in process is less than 600° C. In some embodiments, the gate electrode is formed after removing the n-dipole dopant source layer.

In some embodiments, the dipole engineering process is a first dipole engineering process, the thermal drive-in process is a first thermal drive-in process, the drive-in temperature is a first drive-in temperature, the gate dielectric is a first gate dielectric, the gate electrode is a first gate electrode, the gate stack is a first gate stack, the n-dipole dopant source layer is a first n-dipole dopant source layer, and the n-dipole dopant is a first n-dipole dopant. In such embodiments, forming the first transistor can include forming a second gate stack and performing a second dipole engineering process. The second gate stack includes a second gate dielectric and a second gate electrode. In some embodiments, the second dipole engineering process includes forming a second n-dipole dopant source layer over the second gate dielectric of the second gate stack of the first transistor, performing a second thermal drive-in process that drives a second n-dipole dopant from the second n-dipole dopant source layer into the second gate dielectric, and removing the second n-dipole dopant source layer. In some embodiments, the second gate electrode is formed after removing the second n-dipole dopant source layer.

In some embodiments, a second drive-in temperature of the second thermal drive-in process is less than 600° C. In such embodiments, the first n-dipole dopant can be the same as the second n-dipole dopant, and the first n-dipole dopant and the second n-dipole dopant can be strontium, erbium, magnesium, or a combination thereof. In such embodiments, the first n-dipole dopant can be different than the second n-dipole dopant, the first n-dipole dopant can be strontium, erbium, magnesium, or a combination thereof, and the second n-dipole dopant can be strontium, erbium, magnesium, or a combination thereof.

In some embodiments, a second drive-in temperature of the second thermal drive-in process is at least 600° C. In such embodiments, the first n-dipole dopant is different than the second n-dipole dopant, the first n-dipole dopant can be strontium, erbium, magnesium, or a combination thereof, and the second n-dipole dopant can be lanthanum.

In some embodiments, the second dipole engineering process includes forming a p-dipole dopant source layer over the second gate dielectric of the second gate stack of the first transistor, performing a second thermal drive-in process that drives a p-dipole dopant from the p-dipole dopant source layer into the second gate dielectric, and removing the p-dipole dopant source layer. In such embodiments, the n-dipole dopant can be strontium, erbium, magnesium, or a combination thereof, and the p-dipole dopant can be aluminum.

An exemplary stacked device structure includes a transistor stack having a first transistor disposed over a second transistor. The first transistor has a first gate stack, and the second transistor has a second gate stack. The first gate stack and the second gate stack each include an interfacial layer, a high-k dielectric layer disposed over the interfacial layer, and at least one electrically conductive gate layer disposed over the high-k dielectric layer. An interface region of the high-k dielectric layer and the interfacial layer of the first gate stack includes an n-dipole dopant. The n-dipole dopant is strontium, erbium, magnesium, or a combination thereof. In some embodiments, the first transistor is an n-type transistor, and the second transistor is a p-type transistor.

In some embodiments, the n-dipole dopant is a first n-dipole dopant, the interface region is a first interface region, and a second interface region of the high-k dielectric layer and the interfacial layer of the second gate stack includes a second n-dipole dopant. The second n-dipole dopant can be the same or different than the first n-dipole dopant. In some embodiments, the interface region is a first interface region and a second interface region of the high-k dielectric layer and the interfacial layer of the second gate stack includes a p-dipole dopant.

In some embodiments, the interface region of the high-k dielectric layer and the interfacial layer of the first gate stack includes a portion of the high-k dielectric layer of the first gate stack, a portion of the interfacial layer of the first gate stack, and an interface between the high-k dielectric layer and the interfacial layer of the first gate stack. A peak of a dipole dopant profile of the n-dipole dopant in the interface region is located at the interface ±0.5 nm. The peak of the dipole dopant profile corresponds with a location in the interface region having a maximum n-dipole dopant concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first high-k dielectric layer of a first gate stack of a transistor stack;

forming a first n-dipole dopant source layer over the first high-k dielectric layer;

performing a first thermal drive-in process that drives a first n-dipole dopant from the first n-dipole dopant source layer into the first high-k dielectric layer;

after removing the first n-dipole dopant source layer, forming at least one electrically conductive first gate layer of the first gate stack over the first high-k dielectric layer;

forming a second high-k dielectric layer of a second gate stack of the transistor stack, wherein the second high-k dielectric layer is formed over the first gate stack;

forming a second n-dipole dopant source layer over the second high-k dielectric layer;

performing a second thermal drive-in process that drives a second n-dipole dopant from the second n-dipole dopant source layer into the second high-k dielectric layer, wherein a drive-in temperature of the second thermal drive-in process is less than 600° C.; and after removing the second n-dipole dopant source layer, forming at least one electrically conductive second gate layer of the second gate stack over the second high-k dielectric layer.

2. The method of claim 1, wherein the drive-in temperature is a second drive-in temperature, and a first drive-in temperature of the first thermal drive-in process is different from the second drive-in temperature.

3. The method of claim 1, wherein the second n-dipole dopant is a metal, the second n-dipole dopant source layer includes the metal and oxygen, and the second n-dipole dopant provides the second n-dipole dopant source layer with metal-oxygen bonds having a bond dissociation energy that is less than a bond dissociation energy of lanthanum-oxygen bonds.

4. The method of claim 1, wherein the second n-dipole dopant is strontium.

5. The method of claim 1, wherein the second n-dipole dopant is erbium.

6. The method of claim 1, wherein the second n-dipole dopant is magnesium.

7. The method of claim 1, further comprising forming an interfacial layer before forming the second high-k dielectric layer, wherein the interfacial layer and the second high-k dielectric layer form a second gate dielectric of the second gate stack.

8. The method of claim 7, further comprising tuning parameters of the second thermal drive-in process to provide the second gate dielectric with a desired n-dipole dopant profile along a thickness of the second gate dielectric, wherein a peak of the desired n-dipole dopant profile is located at an interface between the second high-k dielectric layer and the interfacial layer ±0.5 nm, and further wherein the peak of the desired n-dipole dopant profile corresponds with a location in the second gate dielectric having a maximum n-dipole dopant concentration.

9. A method comprising:

forming a first transistor of a transistor stack;

bonding the first transistor of the transistor stack to a precursor for fabricating a second transistor of the transistor stack;

forming the second transistor over the first transistor, wherein the forming the second transistor includes processing the precursor, forming a gate stack of the second transistor, wherein the gate stack includes a gate dielectric and a gate electrode, and performing a dipole engineering process, wherein the dipole engineering process includes:

forming an n-dipole dopant source layer over the gate dielectric, performing a thermal drive-in process that drives an n-dipole dopant from the n-dipole dopant source layer into the gate dielectric, wherein a drive-in temperature of the thermal drive-in process is less than 600° C., and removing the n-dipole dopant source layer, wherein the dipole engineering process is a first dipole engineering process, the thermal drive-in process is a first thermal drive-in process, the drive-in temperature is a first drive-in temperature, the gate dielectric is a first gate dielectric, the gate electrode is a first gate electrode, the gate stack is a first gate stack, the n-dipole dopant source layer is a first n-dipole dopant source layer, and the n-dipole dopant is a first n-dipole dopant; and wherein the forming the first transistor includes forming a second gate stack, wherein the second gate stack includes a second gate dielectric and a second gate electrode, and performing a second dipole engineering process, wherein the second dipole engineering process includes:

forming a second n-dipole dopant source layer over the second gate dielectric of the second gate stack of the first transistor, performing a second thermal drive-in process that drives a second n-dipole dopant from the second n-dipole dopant source layer into the second gate dielectric, wherein a second drive-in temperature of the second thermal drive-in process is less than 600° C., and removing the second n-dipole dopant source layer.

10. The method of claim 9, wherein:

the first n-dipole dopant is the same as the second n-dipole dopant; and the first n-dipole dopant and the second n-dipole dopant are strontium, erbium, magnesium, or a combination thereof.

11. The method of claim 10, wherein:

the first n-dipole dopant and the second n-dipole dopant are strontium.

12. The method of claim 9, wherein:

the first n-dipole dopant is different than the second n-dipole dopant;

the first n-dipole dopant is strontium, erbium, magnesium, or a combination thereof; and the second n-dipole dopant is strontium, erbium, magnesium, or a combination thereof.

13. The method of claim 10, wherein:

the first n-dipole dopant and the second n-dipole dopant are erbium.

14. The method of claim 10, wherein:

the first n-dipole dopant and the second n-dipole dopant are magnesium.

15. A method comprising:

forming a first transistor of a transistor stack;

bonding the first transistor of the transistor stack to a precursor for fabricating a second transistor of the transistor stack;

forming the second transistor over the first transistor, wherein the forming the second transistor includes processing the precursor, forming a gate stack of the second transistor, wherein the gate stack includes a gate dielectric and a gate electrode, and performing a dipole engineering process, wherein the dipole engineering process includes:

forming an n-dipole dopant source layer over the gate dielectric, performing a thermal drive-in process that drives an n-dipole dopant from the n-dipole dopant source layer into the gate dielectric, wherein a drive-in temperature of the thermal drive-in process is less than 600° C., and removing the n-dipole dopant source layer;

wherein the dipole engineering process is a first dipole engineering process, the thermal drive-in process is a first thermal drive-in process, the drive-in temperature is a first drive-in temperature, the gate dielectric is a first gate dielectric, the gate electrode is a first gate electrode, the gate stack is a first gate stack, the n-dipole dopant source layer is a first n-dipole dopant source layer, and the n-dipole dopant is a first n-dipole dopant; and the forming the first transistor includes forming a second gate stack of the first transistor and performing a second dipole engineering process, wherein the second gate stack includes a second gate dielectric and a second gate electrode, and further wherein the second dipole engineering process includes:

forming a second n-dipole dopant source layer over the second gate dielectric of the second gate stack of the first transistor, performing a second thermal drive-in process that drives a second n-dipole dopant from the second n-dipole dopant source layer into the second gate dielectric, wherein a second drive-in temperature of the second thermal drive-in process is at least 600° C., and removing the second n-dipole dopant source layer.

16. The method of claim 15, wherein:

the first n-dipole dopant is different than the second n-dipole dopant;

the first n-dipole dopant is strontium, erbium, magnesium, or a combination thereof; and the second n-dipole dopant is lanthanum.

17. The method of claim 16, wherein:

the first n-dipole dopant is strontium.

18. The method of claim 16, wherein:

the first n-dipole dopant is erbium.

19. The method of claim 16, wherein:

the first n-dipole dopant is magnesium.

20. The method of claim 15, wherein:

the first gate dielectric includes a high-k dielectric layer and an interfacial layer; and the method further includes tuning parameters of the first thermal drive-in process to provide the first gate dielectric with a desired n-dipole dopant profile along a thickness of the first gate dielectric, wherein a peak of the desired n-dipole dopant profile is located at an interface between the high-k dielectric layer and the interfacial layer ±0.5 nm, and further wherein the peak of the desired n-dipole dopant profile corresponds with a location in the first gate dielectric having a maximum n-dipole dopant concentration.

* * * * *